(12) United States Patent
Mason et al.

(10) Patent No.: US 9,989,866 B2
(45) Date of Patent: Jun. 5, 2018

(54) WAFER-BASED LIGHT SOURCE PARAMETER CONTROL

(71) Applicant: Cymer, LLC, San Diego, CA (US)

(72) Inventors: Eric Anders Mason, San Diego, CA (US); Omar Zurita, San Diego, CA (US); Gregory Allen Rechtsteiner, San Diego, CA (US); Willard Earl Conley, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days. days.

(21) Appl. No.: 15/295,524

(22) Filed: Oct. 17, 2016

(65) Prior Publication Data
US 2018/0107123 A1    Apr. 19, 2018

(51) Int. Cl.
*G02B 27/54*    (2006.01)
*G03F 7/20*    (2006.01)

(52) U.S. Cl.
CPC ...... *G03F 7/70625* (2013.01); *G03F 7/70041* (2013.01)

(58) Field of Classification Search
CPC . G03F 7/70041; G03F 7/70196; G03F 7/7006
USPC ...................................... 355/67–71
See application file for complete search history.

(56) References Cited

U.S. PATENT DOCUMENTS

| | | | |
|---|---|---|---|
| 5,661,547 A | 8/1997 | Aketagawa et al. |
| 5,978,409 A | 11/1999 | Das et al. |
| 6,061,382 A | 5/2000 | Govorkov et al. |
| 6,393,037 B1 | 5/2002 | Basting et al. |
| 6,526,086 B1 | 2/2003 | Wakabayashi et al. |
| 6,567,450 B2 | 5/2003 | Myers et al. |
| 6,614,828 B1 | 9/2003 | Basting et al. |
| 6,671,294 B2 | 12/2003 | Kroyan et al. |
| 6,738,410 B2 | 5/2004 | Partlo et al. |
| 6,853,653 B2 | 2/2005 | Spangler et al. |
| 6,985,508 B2 | 1/2006 | Knowles et al. |

(Continued)

FOREIGN PATENT DOCUMENTS

| | | |
|---|---|---|
| DE | 102009039957 A1 | 10/2010 |
| WO | 2014000970 A1 | 1/2014 |

OTHER PUBLICATIONS

Alagna et al., "Optimum ArFi light source bandwidth for 10nm node logic imaging performance," SPIE Microlithography Symposium 2015, Optical Microlithography XXVIII, Feb. 24-Feb. 26, 2015, pp. 1-13.

(Continued)

*Primary Examiner* — Hung Henry Nguyen
(74) *Attorney, Agent, or Firm* — DiBerardino McGovern IP Group LLC

(57) ABSTRACT

A photolithography method includes producing, from an optical source, a pulsed light beam; and scanning the pulsed light beam across a substrate of a lithography exposure apparatus to expose the substrate with the pulsed light beam including exposing each sub-area of the substrate with the pulsed light beam. A sub-area is a portion of a total area of the substrate. For each sub-area of the substrate, a lithography performance parameter associated with the sub-area of the substrate is received; the received lithography performance parameter is analyzed, and, based on the analysis, a first spectral feature of the pulsed light beam is modified and a second spectral feature of the pulsed light beam is maintained.

50 Claims, 13 Drawing Sheets

(56) References Cited

U.S. PATENT DOCUMENTS

| | | |
|---|---|---|
| 7,154,928 B2 | 12/2006 | Sandstrom et al. |
| 7,203,216 B2 | 4/2007 | Ershov et al. |
| 7,366,219 B2 | 4/2008 | Algots et al. |
| 7,382,815 B2 | 6/2008 | Spangler et al. |
| 7,782,922 B2 | 8/2010 | Hori et al. |
| 7,822,084 B2 | 10/2010 | O'Brien et al. |
| 7,885,309 B2 | 2/2011 | Ershov et al. |
| 7,899,095 B2 | 3/2011 | Partlo |
| 8,126,027 B2 | 2/2012 | Algots et al. |
| 8,144,739 B2 | 3/2012 | Figueroa et al. |
| 8,520,186 B2 | 8/2013 | Seong et al. |
| 8,705,004 B2 | 4/2014 | Butler et al. |
| 2002/0012374 A1 | 1/2002 | Basting et al. |
| 2003/0081192 A1 | 5/2003 | Nishi |
| 2006/0244937 A1 | 11/2006 | Nolscher et al. |
| 2006/0256314 A1 | 11/2006 | Nolscher et al. |
| 2007/0297467 A1 | 12/2007 | Fomenkov et al. |
| 2008/0232408 A1 | 9/2008 | O'Brien et al. |
| 2008/0253408 A1 | 10/2008 | Ishihara |
| 2008/0253413 A1 | 10/2008 | Partlo |
| 2008/0285602 A1 | 11/2008 | Nagai et al. |
| 2010/0157266 A1 | 6/2010 | Zimmermann et al. |
| 2011/0122901 A1 | 5/2011 | Sandstrom et al. |
| 2014/0104614 A1 | 4/2014 | Rokitski et al. |
| 2015/0070673 A1* | 3/2015 | Lalovic ............ G03F 7/70041 355/67 |
| 2015/0168848 A1* | 6/2015 | Tanaka ............ G03F 7/70041 355/67 |
| 2015/0355025 A1 | 12/2015 | Duffey et al. |
| 2016/0380402 A1 | 12/2016 | O'Brien et al. |
| 2017/0179677 A1 | 6/2017 | Thornes et al. |

OTHER PUBLICATIONS

Brunner et al., "Laser Bandwidth and Other Sources of Focus Blur in Lithography," Optical Microlithography XIX, Proc. of SPIE, vol. 6154, 2006, pp. 323-330.

Dunstan et al., "Active Spectral Control of DUV Light Sources for OPE Minimization," Optical Microlithography XIX, Proc. of SPIE, vol. 6154, Mar. 15, 2006, 9 pages.

Jacques et al., "Active Spectral-Control Techniques for Improving OPC," Solid State Technology, Dec. 2006, vol. 19, No. 12, 5 pages.

\* cited by examiner

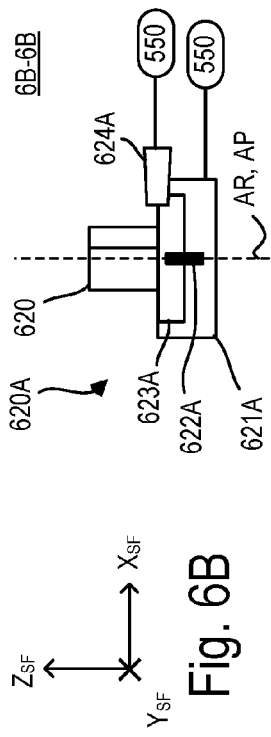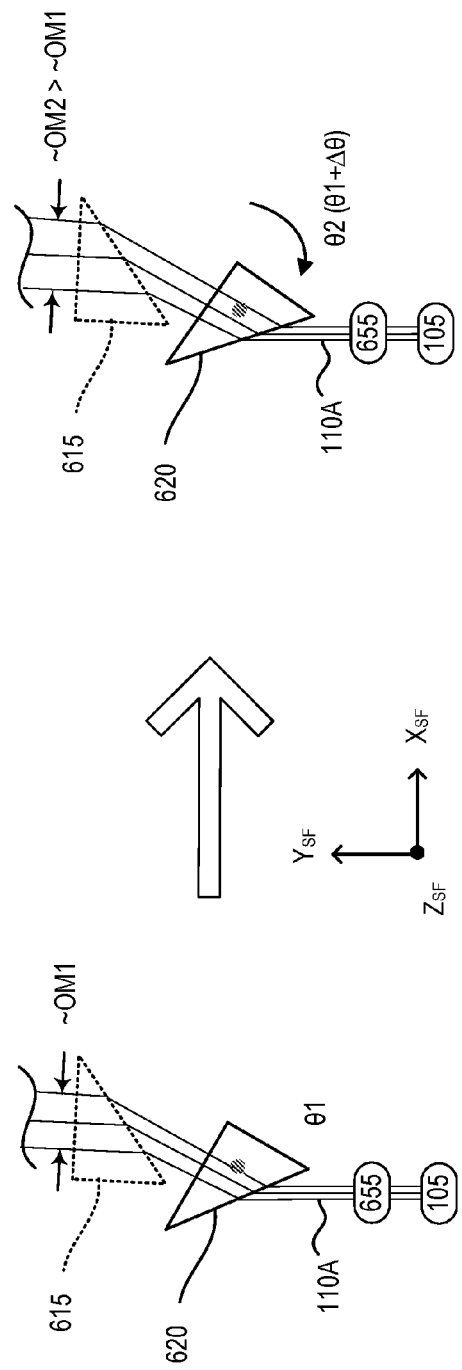

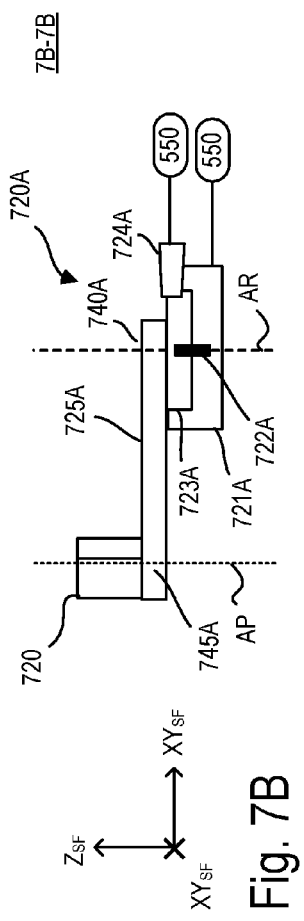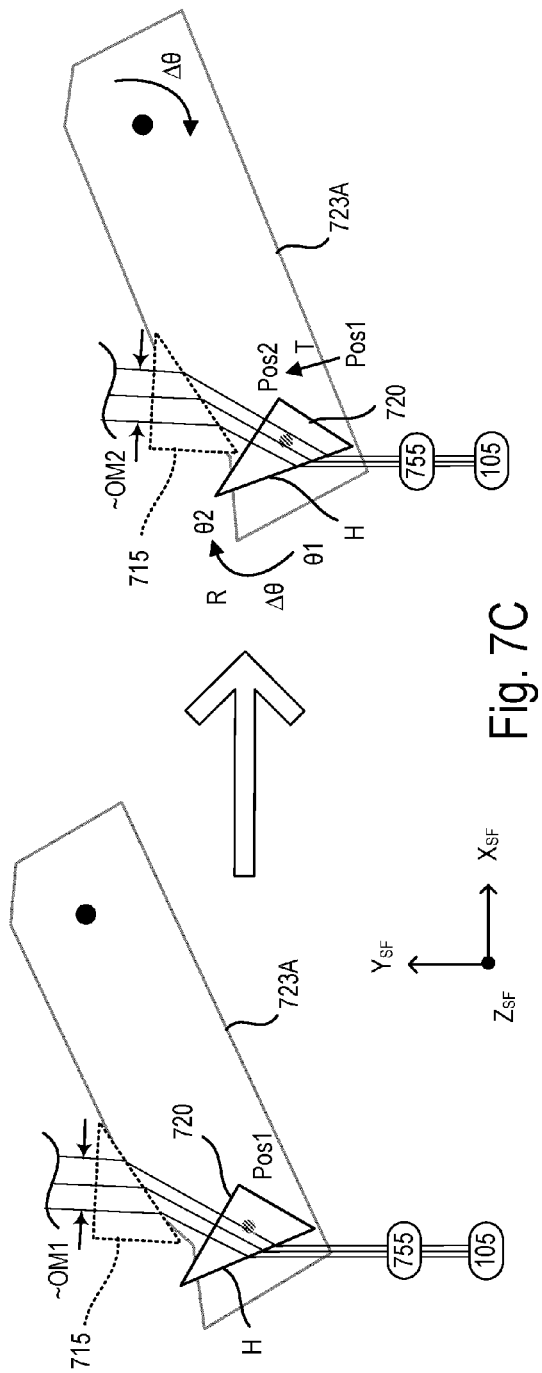
Fig. 7B
Fig. 7C

WAFER-BASED LIGHT SOURCE PARAMETER CONTROL

CROSS REFERENCE TO RELATED APPLICATION

This application is related to U.S. application Ser. No. 15/295,280, filed on Oct. 17, 2016, which is incorporated herein by reference in its entirety.

TECHNICAL FIELD

The disclosed subject matter relates to an apparatus for compensating for variations in lithography performance parameters during scanning of the wafer by adjusting a spectral feature of a pulsed light beam directed toward the wafer.

BACKGROUND

In semiconductor lithography (or photolithography), the fabrication of an integrated circuit (IC) requires a variety of physical and chemical processes performed on a semiconductor (for example, silicon) substrate (which is also referred to as a wafer). A photolithography exposure apparatus or scanner is a machine that applies a desired pattern onto a target portion of the substrate. The wafer is fixed to a stage so that the wafer generally extends along a plane defined by orthogonal $X_L$ and $Y_L$ directions of the scanner. The wafer is irradiated by a light beam, which has a wavelength in the deep ultraviolet (DUV) range. The light beam travels along an axial direction, which corresponds with the $Z_L$ direction of the scanner. The $Z_L$ direction of the scanner is orthogonal to the lateral $X_L$-$Y_L$ plane. The light beam is passed through a beam delivery unit, filtered through a reticle (or mask), and then projected onto a prepared wafer. In this way, a chip design is patterned onto a photoresist that is then etched and cleaned, and then the process repeats.

SUMMARY

In some general aspects, a photolithography apparatus includes: an optical source configured to produce a pulsed light beam; a spectral feature selection system that optically interacts with the pulsed light beam; a scanning optical system configured to scan the pulsed light beam across a substrate positioned in a lithographic apparatus; a metrology apparatus configured to determine at least one lithography performance parameter at each sub-area of the substrate, in which a sub-area is a portion of a total area of the substrate; and a control system connected to the spectral feature selection system, the optical source, and the metrology apparatus. The control system is configured to, at each substrate sub-area: receive the determined lithography performance parameter; analyze the determined lithography performance parameter; and based on the analysis of the determined lithography performance parameter: modify a first spectral feature of the pulsed light beam by sending a first signal to the spectral feature selection system; and maintain a second spectral feature of the pulsed light beam by sending a second signal to the spectral feature selection system while the first spectral feature of the pulsed light beam is being modified.

Implementations can include one or more of the following features. For example, each sub-area of the substrate can be an exposure field of the substrate or each sub-area can correspond to a single pulse of the light beam.

The spectral feature selection system can include a spectral feature actuation mechanism including an actuation system configured to cause one or more elements of the spectral feature actuation mechanism to be altered to thereby alter interaction with the pulsed light beam. The control system can be connected to the actuation system of the spectral feature actuation mechanism such that the first signal is sent to the actuation system of the spectral feature actuation mechanism and the second signal is sent to the actuation system of the spectral feature actuation mechanism.

The lithography performance parameter can be a physical property of the substrate. The control system can be configured to receive the determined value of the physical property of the substrate for each sub-area of the substrate. The physical property of the substrate can include one or more of a mean offset of a position of the substrate from a desired position and a stage vibration of the substrate. The physical property of the substrate can be a position of the substrate that varies from central sub-areas of the substrate to sub-areas at an edge of the substrate.

The spectral feature selection system can include a dispersive optical element and a beam expander including at least three refractive optical elements. The pulsed light beam interacts with each of the dispersive optical element and the plurality of refractive optical elements. The spectral feature selection system can include an actuation system that includes a plurality of actuators, each of the actuators in the plurality causing one of the at least three refractive optical elements to rotate relative to the pulsed light beam. The at least three refractive optical elements can include a first refractive optical element that is farthest from the dispersive optical element, a second refractive optical element adjacent to the first refractive optical element, and a third refractive optical element adjacent to the second refractive optical element. The first refractive optical element can be associated with a first rapid actuator that includes a first rotation stage that rotates about a first rotation axis and includes a region that is mechanically linked to the first refractive optical element to rotate the first refractive optical element about the first rotation axis. The third refractive optical element can be associated with a second rapid actuator that includes a second rotation stage that rotates about a second rotation axis and includes a region that is mechanically linked to the third refractive optical element to rotate the third refractive optical element about the first rotation axis.

The rotation of the first refractive optical element can cause the second spectral feature of the pulsed light beam to be changed in a relatively coarse manner and the rotation of the third refractive optical element can cause the second spectral feature of the pulsed light beam to be changed in a relatively fine manner. The rotation of the second refractive optical element can cause the first spectral feature of the pulsed light beam to be changed in a relatively fine manner. The beam expander can include a fourth refractive optical element, and the rotation of the fourth refractive optical element can cause the first spectral feature of the pulsed light beam to be changed in a relatively coarse manner. The spectral feature selection system can include a reflective optical element between the beam expander and the dispersive optical element.

The control system can analyze the determined lithography performance parameter by determining whether the lithography performance parameter is outside an acceptable range; and the control system can modify the first spectral feature of the pulsed light beam if it is determined that the lithography performance parameter is outside an acceptable range by sending the signal to the spectral feature selection system.

The scanning optical system can be configured to move one or more of the pulsed light beam and the substrate relative to each other along a lateral plane such that the pulsed light beam interacts with each sub-area of the substrate. The lateral plane can be perpendicular to an axial direction along which the pulsed light beam is directed.

The optical source can include: a first gas discharge stage including a first gas discharge chamber housing an energy source and containing a gas mixture that includes a first gain medium; and a second gas discharge stage including a second gas discharge chamber housing an energy source and containing a gas mixture that includes a second gain medium. The first gas discharge stage is configured to generate a first pulsed light beam. The second gas discharge stage is configured to receive the first pulsed light beam and to amplify the first pulsed light beam to thereby produce the pulsed light beam from the optical source.

In other general aspects, a photolithography method includes: producing, from an optical source, a pulsed light beam; and scanning the pulsed light beam across a substrate of a lithography exposure apparatus to expose the substrate with the pulsed light beam including exposing each sub-area of the substrate with the pulsed light beam, wherein a sub-area is a portion of a total area of the substrate. The method includes, for each sub-area of the substrate: receiving a lithography performance parameter associated with the sub-area of the substrate; analyzing the received lithography performance parameter; and based on the analysis, modifying at least a first spectral feature of the pulsed light beam and maintaining at least a second spectral feature of the pulsed light beam.

Implementations can include one or more of the following features. For example, the pulsed light beam can be produced by directing the pulsed light beam through a spectral feature selection system. The method can include selecting the first spectral feature of the pulsed light beam by selectively reflecting the pulsed light beam from a diffractive surface of the spectral feature selection system.

The sub-area of the substrate can be an exposure field of the substrate or it can correspond to a single pulse of the light beam.

The lithography performance parameter can be received at each sub-area of the substrate by receiving the lithography performance parameter at each sub-area of the substrate during scanning of the pulsed light beam across the substrate.

The lithography performance parameter can be received at the sub-area by receiving one or more of an error on the physical property of the substrate, a contrast of a feature formed on the substrate, a critical dimension at a substrate area exposed to the pulsed light beam, the placement (X,Y location relative to desired/target location) of the feature formed on the substrate relative to a target or relative to an underlying feature (that is, an overlay), a photoresist profile, a side-wall angle, and a change in position of the substrate.

The lithography performance parameter at the sub-area can be received by receiving one or o more of a mean offset of a position of the substrate from a desired position and a stage vibration of the substrate. The lithography performance parameter at the sub-area can be received by receiving a position of the substrate that varies from central sub-areas of the substrate to sub-areas at an edge of the substrate.

The lithography performance parameter at each sub-area of the substrate can be received by receiving the lithography performance parameter at each sub-area of the substrate prior to scanning the pulsed light beam across the substrate.

The first spectral feature can be modified by modifying the wavelength of the pulsed light beam, and the second spectral feature can be maintained by maintaining the bandwidth of the pulsed light beam to within a range of bandwidths.

The bandwidth of the pulsed light beam can be maintained to within the range of bandwidths by maintaining the bandwidth of the pulsed light beam to within +/−10 femtometers (fm) or within +/−1 fm.

The first spectral feature of the pulsed light beam can be modified by rotating a first prism system through which the pulsed light beam passes; and the second spectral feature of the pulsed light beam can be maintained by rotating a second prism system through which the pulsed light beam passes. The first prism system and the second prism system can be components within a spectral feature selection system. The first prism system through which the pulsed light beam passes can be rotated by rotating two prisms through which the pulsed light beam passes; and the second prism system through which the pulsed light beam passes can be rotated by rotating at least two other prisms through which the pulsed light beam passes. The two prisms of the first prism system can be rotated by actuating one of the prisms of the first prism system in actuation steps that are larger than the actuation steps for actuation of the other of the prisms of the first prism system. The two other prisms of the second prism system can be rotated by actuating one of the prisms of the second prism system in actuation steps that are larger than the actuation steps for actuation of the other of the prisms of the second prism system.

The first spectral feature of the pulsed light beam can be modified by rotating a mirror on which the pulsed light beam reflects; and the second spectral feature of the pulsed light beam can be maintained by rotating a prism system through which the pulsed light beam passes. The mirror and the prism system are components within a spectral feature selection system.

The method can also include: at least at each sub-area of the substrate, estimating the first spectral feature of the pulsed light beam produced from the optical source; determining whether the estimated first spectral feature is within an acceptable range; and, if it is determined that the estimated first spectral feature is not within the acceptable range, then modifying the first spectral feature of the pulsed light beam.

The method can include: at least at each sub-area of the substrate, estimating the second spectral feature of the pulsed light beam produced from the optical source; determining whether the estimated second spectral feature is within an acceptable range; and, if it is determined that the estimated second spectral feature is not within the acceptable range, then modifying the second spectral feature of the pulsed light beam.

The second spectral feature of the pulsed light beam can be maintained by adjusting the second spectral feature to compensate for changes of the second spectral feature due to the modification of the first spectral feature of the pulsed light beam; and the second spectral feature of the pulsed light beam can be adjusted simultaneously with modifying the first spectral feature of the pulsed light beam.

The received lithography performance parameter can be analyzed by determining whether a physical property of the substrate is outside an acceptable range based on the lithography performance parameter.

The first spectral feature of the pulsed light beam can be modified to thereby cause a modification to a first condition of the pulsed light beam at the substrate and the second spectral feature of the pulsed light beam can be maintained to thereby cause a second condition of the pulsed light beam at the substrate to be maintained at a particular level.

The pulsed light beam can be produced from the optical source by: generating a first pulsed light beam from a first gas discharge stage including selecting the first spectral feature of the pulsed light beam; directing the first pulsed light beam to a second gas discharge stage; and amplifying the first pulsed light beam in the second gas discharge stage to thereby produce the pulsed light beam from the optical source.

The at least the first spectral feature of the pulsed light beam can be modified and the at least the second spectral feature of the pulsed light beam can be maintained by: directing the pulsed light beam through a plurality of prisms toward a diffractive optical element so that the pulsed light beam retro reflects off the diffractive optical element and back through the plurality of prisms; and simultaneously rotating the at least two right-angled prisms so that an angle of incidence of the pulsed light beam on the diffractive optical element is changed but the total magnification of the pulsed light beam on the diffractive optical element is unchanged.

In other general aspects, a photolithography method includes: producing, from an optical source, a pulsed light beam; receiving a recipe that correlates edge roll off of a substrate to each sub-area of the substrate, wherein a sub-area is a portion of a total area of the substrate; scanning the pulsed light beam across the substrate of a lithography exposure apparatus to expose the substrate with the pulsed light beam including exposing each sub-area of the substrate with the pulsed light beam; modifying at least a wavelength of the pulsed light beam so as to adjust the focal position at the substrate to compensate for edge roll off and based on the sub-area being exposed; and maintaining at least a bandwidth of the pulsed light beam while the wavelength of the pulsed light beam is being modified to adjust the focal position at the substrate and compensate for edge roll off for the sub-area being exposed.

DESCRIPTION OF DRAWINGS

FIG. 6B is a view taken along the 6B-6B section of one of the prisms of the apparatus of FIG. 6A;

FIG. 6C is a view along the $Z_{SF}$ direction of the prism of FIG. 6B showing rotation of the prism;

FIG. 7B is a view taken along the 7B-7B section of one of the prisms of the apparatus of FIG. 7A;

FIG. 7C is a view along the $Z_{SF}$ direction of the prism of FIG. 7B showing rotation of the prism;

DESCRIPTION

Figure 1:
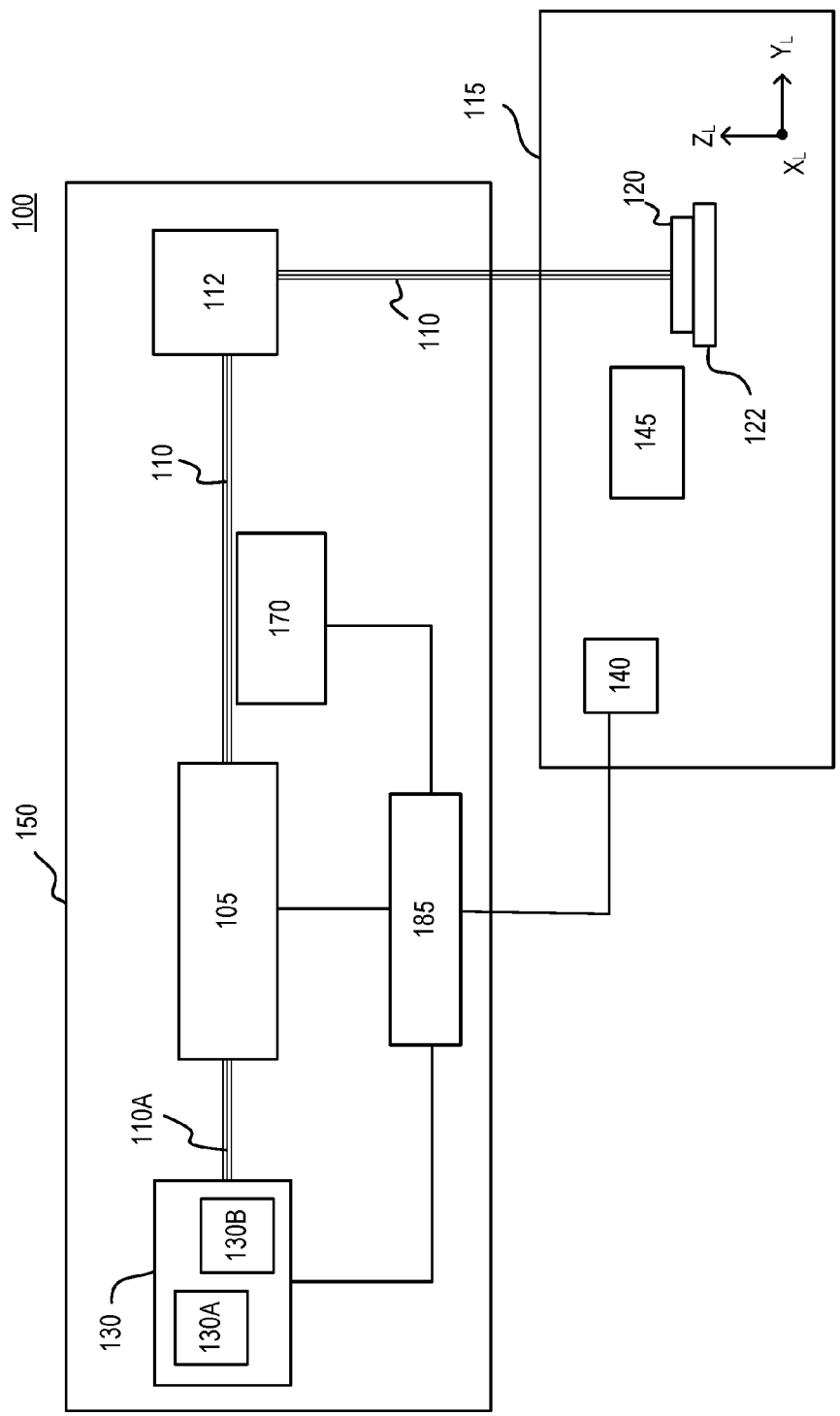
FIG. 1 is a block diagram of a photolithography system producing a pulsed light beam that is directed to a photolithography exposure apparatus.

Referring to FIG. 1, a photolithography system 100 includes an illumination system 150 that produces a pulsed light beam 110 having a wavelength that is nominally at a center wavelength and is directed to a photolithography exposure apparatus or scanner 115. The pulsed light beam 110 is used to pattern microelectronic features on a substrate or wafer 120 that is mounted to a stage 122 in the scanner 115. These microelectronic features patterned on the wafer 120 are limited in size by the critical dimension (CD).

As the pulsed light beam 110 is being scanned across the wafer 120, the scanner 115 or a control system 185 periodically requests changes to a spectral feature (such as the wavelength or the bandwidth) of the light beam 110 to compensate for variations in lithography performance parameters happening at the wafer 120. For example, one or more lithography performance parameters can vary with each sub-area of the wafer 120 that is being scanned by the pulsed light beam 110. A sub-area of the wafer 120 is an area of the wafer 120 that is a fraction of the total area of the wafer that is being scanned and can be an exposure field of the wafer or an area of the wafer 120 that interacts with a single pulse of the light beam 110. The sub-area of the wafer 120 can be that location at which the wafer 120 is being exposed to the light beam 110 at any one particular time.

Such lithography performance parameters at the wafer 120 can be considered to be characteristics associated with the wafer 120 or with the light beam 110 interacting with the wafer 120. For example, chromatic aberration due to the bandwidth of the light beam 110, pressure, temperature, wafer topography or surface shape, change in position of the wafer 120, and error in the focal plane of the light beam 110 are lithography performance parameters that can fluctuate unexpectedly during the scanning across the wafer 120.

The pressure and temperature parameters are, respectively, the pressure and temperature in the environment near the wafer 120 within the scanner 115. Variations in pressure and temperature induce effective changes in the wavelength of the light beam 110, and thus induce changes to the focal plane of the light beam 110.

In a specific example, most projection lenses (used in the path of the light beam 110 as it travels to the wafer 120) have chromatic aberration, which produces an imaging error on the wafer 120 if there is a wavelength error in the light beam 110. One error caused by chromatic aberration is focus error and other errors tend to be much smaller. For example, if the wavelength of the light beam 110 is off of the target wavelength, the image on the wafer 120 will have a significant focal plane error. Thus, it is desirable to be able to change the wavelength of the light beam 110 as it is being scanned across the wafer 120 to compensate for these focal plane errors that are caused by the chromatic aberration.

As another example, a lithography performance parameter that can vary from one sub-area to another of the wafer 120 is the position of the wafer 120 along the $Z_L$ direction. The position of the wafer 120 includes an offset (such as a mean offset), which is a fixed offset from a desired position, and also includes a stage vibration or oscillation, which is an oscillation about that fixed offset in position. The stage vibration along the $Z_L$ direction can be characterized by a moving standard deviation (MSD) value that is derived from a stage error signal. Higher values of stage vibration blur the image and thus cause non-uniformity in the CD. The mean offset along the $Z_L$ direction is characterized by a moving average (MA) value. The topography of the wafer 120 can contribute to or cause an unwanted effect called edge roll off in which the wafer exhibits a different surface geometry at the sub-areas along its edge (and farthest from its central sub-areas). In particular, the wafer 120 best focus position may have a much different value along the edge or near the edge of the wafer 120 than it does near the center of the wafer 120 (such an effect can be seen in FIG. 2, as discussed below).

Figure 2:
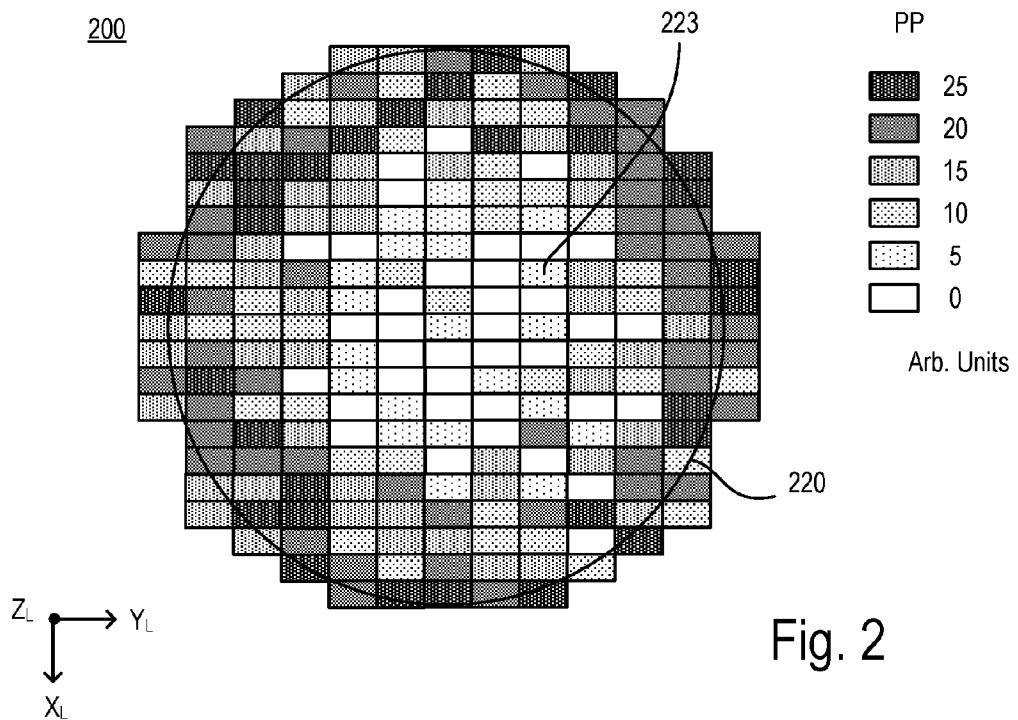
FIG. 2 is a schematic drawing depicting a map of a wafer that is imaged within the photolithography exposure apparatus of FIG. 1, the map showing the sub-areas of the wafer.

Referring to FIG. 2, an exemplary map 200 of a wafer 220 is shown in which a lithography performance parameter PP is plotted for each sub-area (for example, each exposure field 223) of the wafer 220. Higher values of the PP are darker and lower values of the PP are lighter. The map 200 of the wafer 220 shows how the PP varies across exposure fields 223 of the wafer 220. The exposure field 223 of the wafer 220 is the area of the wafer 220 that is exposed in one scan of an exposure slit or window within the scanner 115.

The photolithography system 100 and associated method described herein is designed to enable modifications to a first spectral feature such as the wavelength of the light beam 110 as it is being scanned across the wafer 120 and upon instruction from the scanner 115 to compensate for variations in these performance parameters at the wafer 120. The modification to the first spectral feature of the light beam 110 is implemented by and under control of a spectral feature selection apparatus 130 that is configured to interact with a pulsed light beam 110A that is a seed beam for forming the light beam 110 output from the illumination system 150. Because of the design of the spectral feature selection apparatus 130, other spectral features of the light beam 110 may be coupled to the first spectral feature such that by changing the first spectral feature, a second spectral feature is inadvertently or undesirably changed. Thus, the photolithography system 100 is designed to maintain a second spectral feature (such as the bandwidth) of the light beam 110 to within an acceptable range of values during scanning across the wafer 120 even while the first spectral feature (such as the wavelength) is being modified. In order to maintain the second spectral feature of the light beam 110 to within the acceptable range of values, the photolithography system 100 adjusts the second spectral feature of the light beam 110 so as to compensate for the undesirable change to the second spectral feature caused by the desired change to the first spectral feature. The modification to the second spectral feature (and other spectral features) is also implemented by and under control of the spectral feature selection apparatus 130.

The modifications to the first spectral feature and the adjustments to the second spectral feature happen at each location or sub-area (for example, at each exposure field) of the wafer 120 upon instruction from the scanner 115, and thus occur while the light beam 110 is being scanned across the wafer 120. For example, the wavelength and the bandwidth of the light beam 110 can be adjusted for each sub-area (such as each exposure field) of the wafer 120. These adjustments happen in a rapid manner in order to enable the adjustment to settle into a stable value within the time it takes to go from one sub-area of the wafer 120 to another sub-area of the wafer 120.

In order to enable the rapid adjustment to the bandwidth for each sub-area of the wafer 120, the spectral feature selection apparatus 130 has been redesigned to provide for more rapid adjustment of the bandwidth of the pulsed light beam 110 while the light beam 110 is being scanned across the wafer 120 to enable the adjustment of the bandwidth for each sub-area of the wafer 120.

The spectral feature selection apparatus 130 can include a coarse spectral feature adjustment system 130A and a fine spectral feature adjustment system 130B. The coarse spectral feature adjustment system 130A is used for coarse, large range, and slow control of the spectral feature (such as the bandwidth), and is collection of optical components that interact with the pulsed light beam 110A produced by the optical source 104. A coarse control means that the adjustment step to the spectral feature is relatively large when compared with the adjustment step used in fine control. The fine spectral feature adjustment system 130B is used for fine, narrow range, and fast control of the spectral feature such as the bandwidth. A fine control means that the adjustment step to the spectral feature is relatively small when compared with the adjustment step used in coarse control. The fine spectral feature adjustment system 130B can include an optical system that interacts optically with the pulsed light beam 110A to control one or more spectral features. The fine bandwidth adjustment system 130C can include a non-optical system that interacts with other aspects of the optical source 105 in a rapid manner to control one or more spectral features such as the bandwidth. For example, the fine spectral feature adjustment system 130C can be configured to adjust aspects of the timing associated with the gas discharge chamber or chambers within the optical source 105 to thereby adjust the bandwidth of the pulsed light beam 110.

Details about the photolithography system 100 are described next.

With reference again to FIG. 1, the illumination system 150 includes an optical source 105 that produces the pulsed light beam 110 at a pulse repetition rate that is capable of being changed. The illumination system 150 includes a control system 185 that communicates with the optical source 105 and other features within the illumination system 150. The illumination system 150 also communicates with the scanner 115 to control the operation of the illumination system 150 and aspects of the pulsed light beam 110.

The control system 185 is operatively connected to the pulsed optical source 105 and to the spectral feature selection apparatus 130. And, the scanner 115 includes a lithography controller 140 operatively connected to the control system 185 and components within the scanner 115.

The pulse repetition rate of the pulsed light beam 110 is the rate at which pulses of the light beam 110 are produced by the optical source 105. Thus, for example, the repetition rate of the pulsed light beam 110 is 1/Δt, where Δt is the time between the pulses. The control system 185 is generally configured to control the repetition rate at which the pulsed light beam 110 is produced including modifying the repetition rate of the pulsed light beam as it is exposing the wafer 120 in the scanner 115.

In some implementations, the scanner 115 triggers the optical source 105 (through the communication between the controller 140 and the control system 185) to produce the pulsed light beam 110, so the scanner 115 controls the repetition rate, spectral features such as the bandwidth or wavelength, and/or the dose by way of the controller 140 and the control system 185. For example, the controller 140 sends a signal to the control system 185 to maintain the repetition rate of the light beam 110 within a particular range of acceptable rates. The scanner 115 generally maintains the repetition rate constant for each burst of pulses of the light beam 110. A burst of pulses of the light beam 110 can correspond to an exposure field on the wafer 120. A burst of pulses can include anywhere from 10 to 500 pulses, for example.

The critical dimension (CD) is the smallest feature size that can be printed on the wafer 120 by the system 100. The CD depends on the wavelength of the light beam 110. Thus, in order to maintain a uniform CD of the microelectronic features printed on the wafer 120, and on other wafers exposed by the system 100, the center wavelength of the light beam 110 should remain at an expected or target center wavelength or within a range of wavelengths around the target wavelength. Thus, in addition to maintaining the center wavelength at the target center wavelength or within a range of acceptable wavelengths about the target center wavelength, it is desirable to maintain the bandwidth of the light beam 110 (the range of wavelengths in the light beam 110) to within an acceptable range of bandwidths.

In order to maintain the bandwidth of the light beam 110 to an acceptable range, or to adjust the bandwidth of the light beam 110, the control system 185 is configured to determine an amount of adjustment to the bandwidth of the pulsed light beam 110. Additionally, the control system 185 is configured to send a signal to the spectral feature selection apparatus 130 to move at least one optical component of the apparatus 130 (for example, a prism) to thereby change the bandwidth of the pulsed light beam 110 by the determined adjustment amount as the pulsed light beam 110 is exposing the wafer 120 to thereby compensate for the bandwidth variation caused by the modification of the pulse repetition rate of the pulsed light beam 110.

The bandwidth of the pulsed light beam 110 can be changed in between any two bursts of pulses. Moreover, the time that it takes for the bandwidth to be changed from a first value to a second value and also to stabilize at the second value should be less than the time between the bursts of pulses. For example, if the period of time between bursts is 50 milliseconds (ms), then the total time to change the bandwidth from a first value to a second value and stabilize at the second value should be less than 50 ms. The control system 185 and the spectral feature selection apparatus 130 are designed to enable such a rapid change of the bandwidth, as discussed in detail below.

The controller 140 of the scanner 115 sends a signal to the control system 185 to adjust or modify an aspect (such as the bandwidth or the repetition rate) of the pulsed light beam 110 that is being scanned across the wafer 120. The signal sent to the control system 185 can cause the control system 185 to modify an electrical signal sent to the pulsed optical source 105 or an electrical signal sent to the apparatus 130. For example, if the pulsed optical source 105 includes a gas laser amplifier then the electrical signal provides a pulsed current to electrodes within one or more gas discharge chambers of the pulsed optical source 105.

The wafer 120 is placed on the wafer stage 122 (also referred to as a table) and the stage 122 is connected to a positioner configured to accurately position the wafer 120 in accordance with certain parameters and under control of the controller 140.

The photolithography system 100 can also include a measurement system 170, which can include a sub-system that measures one or more spectral features (such as the bandwidth or wavelength) of the light beam 110. Because of various disturbances applied to the photolithography system 100 during operation, the value of the spectral feature (such as the bandwidth or the wavelength) of the light beam 110 at the wafer 120 may not correspond to or match with the desired spectral feature (that is, the spectral feature that the scanner 115 expects). Thus, the spectral feature (such as a characteristic bandwidth) of light beam 110 is measured or estimated during operation by estimating a value of a metric from the optical spectrum so that an operator or an automated system (for example, a feedback controller) can use the measured or estimated bandwidth to adjust the properties of the optical source 105 and to adjust the optical spectrum of the light beam 110. The sub-system of the measurement system 170 measures the spectral feature (such as the bandwidth and/or the wavelength) of the light beam 110 based on this optical spectrum.

The measurement system 170 receives a portion of the light beam 110 that is redirected from a beam separation device that is placed in a path between the optical source 105 and the scanner 115. The beam separation device directs a first portion or percentage of the light beam 110 into the measurement system 170 and directs a second portion or percentage of the light beam 110 toward the scanner 115. In some implementations, the majority of the light beam 110 is directed in the second portion toward the scanner 115. For example, the beam separation device directs a fraction (for example, 1-2%) of the light beam 110 into the measurement system 170. The beam separation device can be, for example, a beam splitter.

Figure 3:
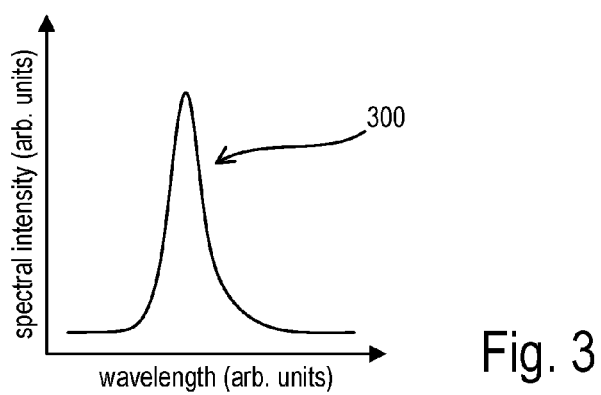
FIG. 3 is a graph of an exemplary optical spectrum of the pulsed light beam produced by the photolithography system of FIG. 1.

The pulses of the light beam 110 are centered around a wavelength that is in the deep ultraviolet (DUV) range, for example, with wavelengths of 248 nanometers (nm) or 193 nm. The size of the microelectronic features patterned on the wafer 120 depends on the wavelength of the pulsed light beam 110, with a lower wavelength resulting in a small minimum feature size or critical dimension. When the wavelength of the pulsed light beam 110 is 248 nm or 193 nm, the minimum size of the microelectronic features can be, for example, 50 nm or less. The bandwidth that is used for analysis and control of the pulsed light beam 110 can be the actual, instantaneous bandwidth of its optical spectrum 300 (or emission spectrum), as shown in FIG. 3. The optical spectrum 300 contains information about how the optical energy or power of the light beam 110 is distributed over different wavelengths (or frequencies). The optical spectrum 300 of the light beam 110 is depicted in the form of a diagram where the spectral intensity (not necessarily with an absolute calibration) is plotted as a function of the wavelength or optical frequency. The optical spectrum 300 can be referred to as the spectral shape or intensity spectrum of the light beam 110. Spectral properties or features of the light beam 110 include any aspect or representation of the intensity spectrum. For example, bandwidth is a spectral feature. The bandwidth of the light beam is a measure of the width of this spectral shape, and this width can be given in terms of wavelength or frequency of the laser light. Any suitable mathematical construction (that is, metric) related to the details of the optical spectrum 300 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As another example, the width of the spectrum that contains a fraction (Y) of the integrated spectral intensity (referred to as EY) can be used to characterize the light beam bandwidth.

The light beam 110 is directed through a beam preparation system 112, which can include optical elements that modify aspects of the light beam 110. For example, the beam preparation system 112 can include reflective and/or refractive optical elements, optical pulse stretchers, and optical apertures (including automated shutters).

The spectral feature selection apparatus 130 is placed at a first end of the optical source 105 to interact with a light beam 110A produced by the optical source 105. The light beam 110A is a beam produced at one end of the resonators within the optical source 105 and can be a seed beam produced by a master oscillator, as discussed below. The spectral feature selection apparatus 130 is configured to finely tune the spectral properties of the pulsed light beam 110 by tuning or adjusting one or more spectral features (such as the bandwidth or wavelength) of the pulsed light beam 110A.

Figure 4:
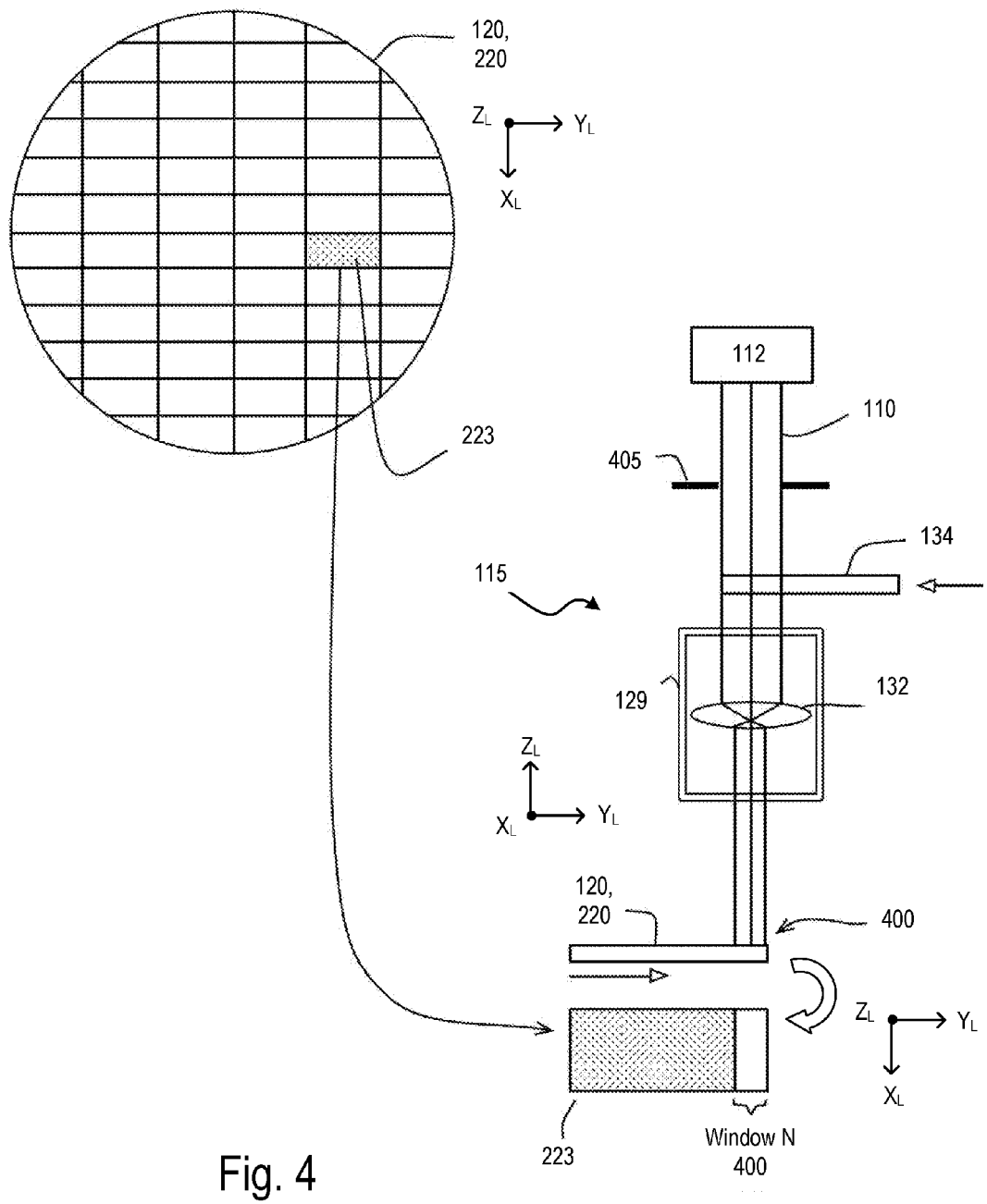
FIG. 4 is a block diagram of an exemplary photolithography exposure apparatus that can be used in the photolithography system of FIG. 1.

Referring also to FIG. 4, the wafer 120, 220 is irradiated by the light beam 110. The lithography exposure apparatus 115 includes an optical arrangement that includes an illuminator system 129 having, for example, one or more condenser lenses, a mask 134, and an objective arrangement 132. The mask 134 is movable along one or more directions, such as along a $Z_L$ direction (which generally corresponds to the axial direction of the light beam 110) or in an $X_L$-$Y_L$ plane that is perpendicular to the $Z_L$ direction. The objective arrangement 132 includes a projection lens and enables the image transfer to occur from the mask 134 to the photoresist on the wafer 120. The illuminator system 129 adjusts the range of angles for the light beam 110 impinging on the mask 134. The illuminator system 129 also homogenizes (makes uniform) the intensity distribution of the light beam 110 across the mask 134.

The lithography apparatus 115 can include, among other features, a lithography controller 140, air conditioning devices, and power supplies for the various electrical components. The lithography controller 140 controls how layers are printed on the wafer 120.

In some implementations, an immersion medium can be supplied to cover the wafer 120. The immersion medium can be a liquid (such as water) for liquid immersion lithography. In other implementations in which the lithography is a dry system, the immersion medium can be a gas such as dry nitrogen, dry air, or clean air. In other implementations, the wafer 120 can be exposed within a pressure-controlled environment (such as a vacuum or partial vacuum).

Referring again to FIG. 4, a process program or recipe determines the length of the exposure on the wafer 120, the mask 134 used, as well as other factors that affect the exposure. During lithography, a plurality of pulses of the light beam 110 illuminate the same area of the wafer 120 to form an illumination dose. The number of pulses N of the light beam 110 that illuminate the same area can be referred to as an exposure window 400 and the size of the window 400 can be controlled by an exposure slit 405 placed before the mask 134. The slit 405 can be designed like a shutter and can include a plurality of blades that can be opened and closed. And, the size of the exposed area is determined by the distance between the blades in the non-scanning direction and also by the length (distance) of the scan in the scanning direction. In some implementations, the value of N is in the tens, for example, from 10-100 pulses. In other implementations, the value of N is greater than 100 pulses, for example, from 100-500 pulses.

One or more of the wafer stage 122, the mask 134, and the objective arrangement 132 are fixed to associated actuation systems to thereby form a scanning arrangement (or scanning optical system). In the scanning arrangement, one or more of the mask 134, the objective arrangement 132, and the wafer 120 (via the stage 122) are moved relative to each other during the exposure to scan the exposure window 400 across an exposure field 223.

Referring again to FIG. 1, the photolithography system 100 also includes a wafer metrology apparatus 145 that is configured to determine a value of the lithography performance parameter PP for each sub-area (for example, for each exposure field 223) of the wafer 120, 220. The metrology apparatus 145 is connected to the control system 185 so that the control system 185 receives the values of the lithography performance parameter PP for each wafer sub-area. The control system 185 can store the values of the lithography performance parameter PP for each wafer sub-area.

In some implementations, the metrology apparatus 145 is configured to be used in an offline mode in which the wafer 120, 220 is analyzed after the wafer 120, 220 has been patterned by the light beam 110. The data obtained by such a scan can be used by the control system 185 for one or more wafers that will be scanned in the future.

In other implementations, the metrology apparatus 145 is used in an online mode in which the wafer 120, 220 is analyzed while the wafer 120, 220 is being patterned by the light beam 110. For example, the exposure field of the wafer 120, 220 could be probed in between bursts of the light beam 110.

Referring again to FIG. 1, the metrology apparatus 145 can be any apparatus that can probe the lithography performance parameter PP.

For example, if the performance parameter PP that is being monitored is the wafer topography, then the metrology apparatus 145 can be the scanner 115, which can perform such monitoring during exposure or between scans of the wafer 120. The topography of the wafer 120 can be controlled by adjusting the wavelength of the light beam 110.

The metrology apparatus 145 can be a self-contained system such as a high resolution scanning electron microscope (SEM) that is designed for high resolution imaging, to be able to display feature sizes of less than, for example 1 nm. The SEM is a type of electron microscope that produces images of a sample (in this case, the wafer 120) by scanning the wafer 120 with a focused beam of electrons. The SEM can achieve resolution better than 1 nanometer (nm).

The wafer 120 can be observed in any suitable environment such as in high vacuum, in low vacuum, (in environmental SEM) in wet conditions and at a wide range of cryogenic or elevated temperatures. The most common mode of detection is by secondary electrons emitted by atoms excited by the electron beam. The number of secondary electrons is a function of the angle between the surface of the wafer 120 and the electron beam. In other systems, back-scattered electrons or x-rays can be detected.

The metrology apparatus 145 can employs scanning white light interferometry, which provides quantitative noncontact, three dimensional measurements of the wafer 120. In this technique, a white light beam passes through a filter and then a microscope objective lens to the surface of the wafer 120. The light reflecting back from the surface of the wafer 120 is combined with a reference beam and captured for software analysis within the apparatus 145. After obtaining data for each point, the apparatus 145 can generate a three dimensional image (topography) of the surface of the wafer 120. Such a topographical map of the wafer 120 enables the measurement of these other lithography performance parameters as well: local step height, critical dimensions (CD), overlay, multilayer film thickness and optical properties, combined topography and film thickness, and wafer bow.

In other implementations, the metrology apparatus 145 is a scatterometer that transmits a pulse of energy toward the wafer 120 and measures the reflected or diffracted energy from the wafer 120. The scatterometer can combine a measurement of overlay, focus, and CD in one sensor. In some implementations, the metrology apparatus 145 is the YieldStar S-250D (made by ASML Netherlands B.V. of Veldhoven, The Netherlands), which is a standalone metrology tool that allows measurement of on-product overlay and focus using diffraction based overlay and diffraction based focus techniques as well as the optional capability to measure CD.

In some implementations, the metrology apparatus 145 is an overlay metrology apparatus that determines whether the separate patterns of materials placed on each layer of the wafer 120 are aligned correctly. For example, the overlay metrology apparatus determines whether the contacts, lines, and transistors of each layer of the wafer line up with each other. Misalignment of any kind between the patterns can cause short circuits and connection failures, which in turn would impact yield and profit margins. Thus, in practice, the overlay metrology apparatus is used after each layer is formed on the wafer 120 but after the second layer is formed. The overlay metrology apparatus measures a relative position of the most recently formed (that is, the current) layer on the wafer to a previously formed layer on the wafer, where the most recently formed layer is formed on the previously formed layer. The relative position between the current wafer layer and the previously formed wafer layer is measured for each location at which the light beam exposes the wafer (if the characteristic of the light beam 110 measured at the wafer 120 corresponds to the location).

The metrology apparatus 145 can measure Critical Dimension (CD), which correlates to the printed feature size. SEMs and scatterometry tools can be used for measuring CD. The metrology apparatus 145 can measure overlay to check for image placement error relative to design intent and/or previously patterned layers. Optical and diffraction based tools can be used for measuring overlay.

Figure 5A:
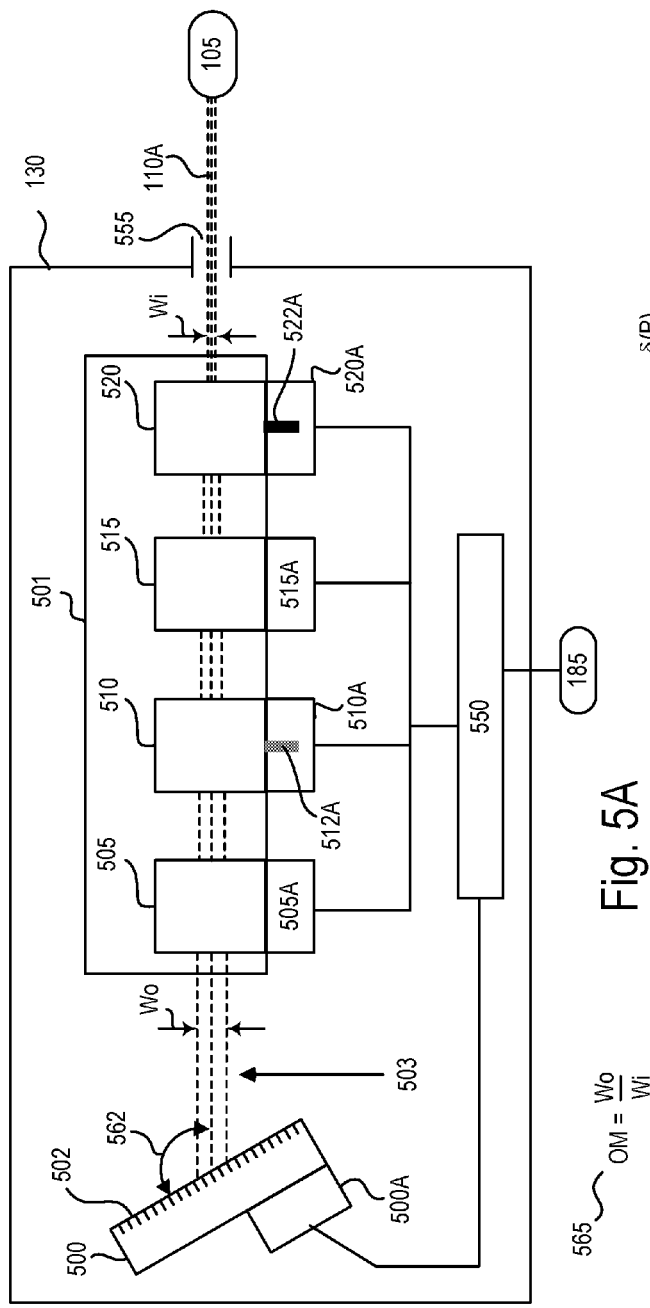
FIG. 5A is a block diagram of an exemplary spectral feature selection apparatus that can be used in the photolithography system of FIG. 1.

Referring to FIG. 5A, in some implementations, the spectral feature selection apparatus 130 includes a set of optical features or components 500, 505, 510, 515, 520 arranged to optically interact with the pulsed light beam 110A and a control module 550 that includes electronics in the form of any combination of firmware and software. The optical components 500, 505, 510, 515, 520 can be configured to provide a coarse spectral feature adjustment system 130A; and, if the adjustment of such components is rapid enough, it can be configured to provide a fine spectral feature adjustment system 130B. Although not shown in FIG. 5A, it is possible for the spectral feature selection apparatus 130 to include other optical features or other non-optical features for providing fine spectral feature control.

The control module 550 is connected to one or more actuation systems 500A, 505A, 510A, 515A, 520A physically coupled to respective optical components 500, 505, 510, 515, 520. The optical components of the apparatus 130 include a dispersive optical element 500, which can be a grating, and a beam expander 501 made of a set of refractive optical elements 505, 510, 515, 520, which can be prisms. The grating 500 can be a reflective grating that is designed to disperse and reflect the light beam 110A; accordingly, the grating 500 is made of a material that is suitable for interacting with a pulsed light beam 110A having a wavelength in the DUV range. Each of the prisms 505, 510, 515, 520 is a transmissive prism that acts to disperse and redirect the light beam 110A as it passes through the body of the prism. Each of the prisms can be made of a material (such as, for example, calcium fluoride) that permits the transmission of the wavelength of the light beam 110A. Although four refractive optical elements 505, 510, 515, 520 are shown, it is possible for fewer than four or more than four to be used in the beam expander 501.

The prism 520 is positioned farthest from the grating 500 while the prism 505 is positioned closest to the grating 500. The pulsed light beam 110A enters the apparatus 130 through an aperture 555, and then travels through the prism 520, the prism 510, and the prism 505, in that order, prior to impinging upon a diffractive surface 502 of the grating 500. With each passing of the beam 110A through a consecutive prism 520, 515, 510, 505, the light beam 110A is optically magnified and redirected (refracted at an angle) toward the next optical component. The light beam 110A is diffracted and reflected from the grating 500 back through the prism 505, the prism 510, the prism 515, and the prism 520, in that order, prior to passing through the aperture 555 as the light beam 110A exits the apparatus 130. With each passing through the consecutive prisms 505, 510, 515, 520 from the grating 300, the light beam 110A is optically compressed as it travels toward the aperture 555.

Figure 5B:
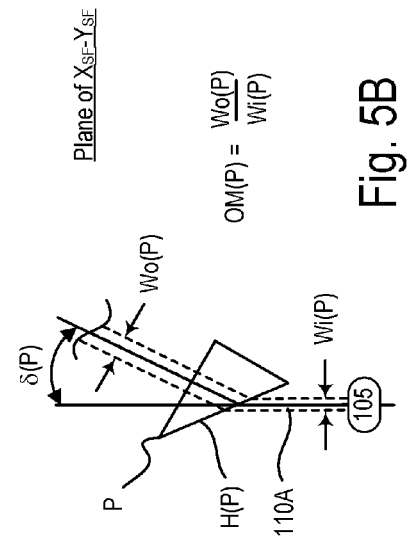
FIG. 5B is a block diagram of an exemplary prism within the spectral feature selection apparatus of FIG. 5A, and showing a beam magnification and beam refraction angle through the prism.

Referring to FIG. 5B, the rotation of a prism P (which can be any one of prisms 505, 510, 515, or 520) of the beam expander 501 changes an angle of incidence at which the light beam 110A impinges upon the entrance surface H(P) of that rotated prism P. Moreover, two local optical qualities, namely, an optical magnification OM(P) and a beam refraction angle $\delta(P)$, of the light beam 110A through that rotated prism P are functions of the angle of incidence of the light beam 110A impinging upon the entrance surface H(P) of that rotated prism P. The optical magnification OM(P) of the light beam 110A through the prism P is the ratio of a transverse wide Wo(P) of the light beam 110A exiting that prism P to a transverse width Wi(P) of the light beam 110A entering that prism P.

A change in the local optical magnification OM(P) of the light beam 110A at one or more of the prisms P within the beam expander 501 causes an overall change in the optical magnification OM 565 of the light beam 110A through the beam expander 501. The optical magnification OM 565 of the light beam 110A through the beam expander 501 is the ratio of the transverse width Wo of the light beam 110A exiting the beam expander 501 to a transverse width Wi of the light beam 110A entering the beam expander 501.

Additionally, a change in the local beam refraction angle δ(P) through one or more of the prisms P within the beam expander 501 causes an overall change in an angle of incidence of 562 of the light beam 110A at the surface 502 of the grating 500.

The wavelength of the light beam 110A can be adjusted by changing the angle of incidence 562 at which the light beam 110A impinges upon the diffractive surface 502 of the grating 500. The bandwidth of the light beam 110A can be adjusted by changing the optical magnification 565 of the light beam 110.

The spectral feature selection apparatus 130 is redesigned to provide for more rapid adjustment of the bandwidth of the pulsed light beam 110 while the light beam 110 is being scanned across the wafer 120 by the scanner 115. The spectral feature selection apparatus 130 can be redesigned with one or more new actuation systems for more effectively and more rapidly rotating one or more of the optical components 500, 505, 510, 515, 520.

For example, the spectral feature selection apparatus 130 includes a new actuation system 520A for more effectively and more rapidly rotating the prism 520. The new actuation system 520A can be designed in a manner that increases the speed with which the prism 520 is rotated. Specifically, the axis of rotation of the prism 520 mounted to the new actuation system 520A is parallel with a rotatable motor shaft 522A of the new actuation system 520A. In other implementations, the new actuation system 520A can be designed to include an arm that is physically linked to the motor shaft 522A at one end and physically linked to the prism 520 at the other end to provide additional leverage for rotating the prism 520. In this way, the optical magnification OM of the light beam 110A is made to be more sensitive to rotation of the prism 520.

In some implementations, the prism 505 is flipped relative to the prior design of the beam expander to provide for more rapid adjustment of the bandwidth. In these cases, the bandwidth change becomes relatively faster (when compared with prior designs of the apparatus 130) with a relatively smaller rotation of the prism 520. The change in optical magnification per unit rotation of the prism 520 is increased in the redesigned spectral feature selection apparatus 130 when compared with prior spectral feature selection apparatuses.

The apparatus 130 is designed to adjust the wavelength of the light beam 110A that is produced within the resonator or resonators of the optical source 105 by adjusting an angle 562 of incidence of at which the light beam 110A impinges upon the diffractive surface 502 of the grating 500. Specifically, this can be done by rotating one or more of the prisms 505, 510, 515, 520 and the grating 500 to thereby adjust the angle of incidence 562 of the light beam 110A.

Moreover, the bandwidth of the light beam 110A that is produced by the optical source 105 is adjusted by adjusting the optical magnification OM 565 of the light beam 110A. Thus, the bandwidth of the light beam 110A can be adjusted by rotating one or more of the prisms 505, 510, 515, 520, which causes the optical magnification 565 of the light beam 110A to change.

Because the rotation of a particular prism P causes a change in both the local beam refraction angle δ(P) and the local optical magnification OM(P) at that prism P, the control of wavelength and bandwidth are coupled in this design.

Additionally, the bandwidth of the light beam 110A is relatively sensitive to the rotation of the prism 520 and relatively insensitive to rotation of the prism 505. This is because any change in the local optical magnification OM(520) of the light beam 110A due to the rotation of the prism 520 is multiplied by the product of the change in the optical magnification OM(515), OM(510), OM(505), respectively, in the other prisms 515, 510, and 505 because those prisms are between the rotated prism 520 and the grating 500, and the light beam 110A must travel through these other prisms 515, 510, 505 after passing through the prism 520. On the other hand, the wavelength of the light beam 110A is relatively sensitive to the rotation of the prism 505 and relatively insensitive to the rotation of the prism 520.

For example, in order to change the bandwidth without changing the wavelength, the optical magnification 565 should be changed without changing the angle of incidence 562, and this can be achieved by rotating the prism 520 by a large amount and rotating the prism 505 by a small amount.

The control module 550 is connected to one or more actuation systems 500A, 505A, 510A, 515A, 520A that are physically coupled to respective optical components 500, 505, 510, 515, 520. Although an actuation system is shown for each of the optical components it is possible that some of the optical components in the apparatus 130 are either kept stationary or are not physically coupled to an actuation system. For example, in some implementations, the grating 500 can be kept stationary and the prism 515 can be kept stationary and not physically coupled to an actuation system.

Each of the actuation systems 500A, 505A, 510A, 515A, 520A includes one or more actuators that are connected to its respective optical components. The adjustment of the optical components causes the adjustment in the particular spectral features (the wavelength and/or bandwidth) of the light beam 110A. The control module 550 receives a control signal from the control system 185, the control signal including specific commands to operate or control one or more of the actuation systems. The actuation systems can be selected and designed to work cooperatively.

Each of the actuators of the actuation systems 500A, 505A, 510A, 515A, 520A is a mechanical device for moving or controlling the respective optical component. The actuators receive energy from the module 550, and convert that energy into some kind of motion imparted to the respective optical component. For example, the actuation systems can be any one of force devices and rotation stages for rotating one or more of prisms of a beam expander. The actuation systems can include, for example, motors such as stepper motors, valves, pressure-controlled devices, piezoelectric devices, linear motors, hydraulic actuators, voice coils, etc.

The grating 500 can be a high blaze angle Echelle grating, and the light beam 110A incident on the grating 500 at any angle of incidence 562 that satisfies a grating equation will be reflected (diffracted). The grating equation provides the relationship between the spectral order of the grating 500, the diffracted wavelength (the wavelength of the diffracted beam), the angle of incidence 562 of the light beam 110A onto the grating 500, the angle of exit of the light beam 110A diffracted off the grating 500, the vertical divergence of the light beam 110A incident onto the grating 500, and the groove spacing of the diffractive surface of the grating 500. Moreover, if the grating 500 is used such that the angle of incidence 562 of the light beam 110A onto the grating 500 is equal to the angle of exit of the light beam 110A from the grating 500, then the grating 500 and the beam expander (the prisms 505, 510, 515, 520) are arranged in a Littrow configuration and the wavelength of the light beam 110A reflected from the grating 500 is the Littrow wavelength. It can be assumed that the vertical divergence of the light beam 110A incident onto the grating 500 is near zero. To reflect the nominal wavelength, the grating 500 is aligned, with respect to the light beam 110A incident onto the grating 500, so that the nominal wavelength is reflected back through the beam expander (the prisms 505, 510, 515, 520) to be amplified in the optical source 105. The Littrow wavelength can then be tuned over the entire gain bandwidth of the resonators within optical source 105 by varying the angle of incidence 562 of the light beam 110A onto the grating 500.

Each of the prisms 505, 510, 515, 520 is wide enough along the transverse direction of the light beam 110A so that the light beam 110A is contained within the surface at which it passes. Each prism optically magnifies the light beam 110A on the path toward the grating 500 from the aperture 555, and therefore each prism is successively larger in size from the prism 520 to the prism 505. Thus, the prism 505 is larger than the prism 510, which is larger than the prism 515, and the prism 520 is the smallest prism.

The prism 520 that is the farthest from the grating 500, and is also the smallest in size, is mounted on the actuation system 520A, and specifically to the rotation shaft 522A, which causes the prism 520 to rotate, and such rotation changes the optical magnification of the light beam 110A impinging upon the grating 500 to thereby modify the bandwidth of the light beam 110A output from the apparatus 130. The actuation system 520A is designed as a rapid actuation system 520A because it includes a rotary stepper motor that includes the rotation shaft 522A to which the prism 520 is fixed. The rotation shaft 522A rotates about its shaft axis, which is parallel with the rotation axis of the prism 520. Moreover, because the actuation system 520A includes the rotary stepper motor, it lacks any mechanical memory and also lacks an energy ground state. Each location of the rotation shaft 522A is at the same energy as each of the other locations of the rotation shaft 522A and the rotation shaft 522A lacks a preferred resting location with a low potential energy.

In some implementations, the actuation system 510A (to which the prism 510 is mounted) can be a rapid actuation system similar to the rapid actuation system 520A. In this way, the actuation system 510A can include a rotation shaft 512A, which causes the prism 510 to rotate, and such rotation changes the optical magnification of the light beam 110A impinging upon the grating 500 to thereby modify the bandwidth of the light beam 110A output from the apparatus 130. The actuation system 510A is therefore designed as a rapid actuation system (similarly to system 520A) because it includes a rotary stepper motor that includes the rotation shaft 512A to which the prism 510 is fixed. The rotation shaft 512A rotates about its shaft axis, which is parallel with the rotation axis of the prism 510. Moreover, because the actuation system 510A includes the rotary stepper motor, it lacks any mechanical memory and also lacks an energy ground state. Each location of the rotation shaft 512A is at the same energy as each of the other locations of the rotation shaft 512A and the rotation shaft 512A lacks a preferred resting location with a low potential energy.

As discussed above, the bandwidth of the light beam 110A is relatively sensitive to the rotation of the prism 520 and relatively insensitive to rotation of the prism 505. This is because any change in the local optical magnification OM(520) of the light beam 110A due to the rotation of the prism 520 is multiplied by the product of the change in the optical magnification OM(515), OM(510), OM(505), respectively, in the other prisms 515, 510, and 505 because those prisms are between the rotated prism 520 and the grating 500, and the light beam 110A must travel through these other prisms 515, 510, 505 after passing through the prism 520. On the other hand, the wavelength of the light beam 110A is relatively sensitive to the rotation of the prism 505 and relatively insensitive to the rotation of the prism 520. Thus, the wavelength can be coarsely changed by rotating the prism 505, and the prism 520 can be rotated (in a coarse manner). The angle of incidence 562 of the light beam 110A is changed due to the rotation of the prism 505 and the rotation of the prism 520 offset the change in magnification caused by the rotation of the prism 505. Moreover, the newly designed rapid actuation system 520A enables the bandwidth to be rapidly changed to quickly offset the unwanted change in magnification. Additionally, if the bandwidth needs to be more finely controlled, then the prism 510 can be rapidly rotated using the newly designed rapid actuation system 510A. It is also possible to more finely control the wavelength by rotating the prism 515 with the actuation system 515A, which can include a piezoelectric stage.

The prism 520 can be used for coarse, large range, and slow bandwidth control. By contrast, the bandwidth can be controlled in a fine and narrow range and even more rapidly by controlling the prism 510.

In some implementations, the spectral feature selection apparatus 130 can include a beam deflector such as a mirror that is placed at a location 503 between the beam expander 501 and the grating 500 and along the path of the light beam 110A as it travels between the beam expander 501 and the grating 500. The mirror is rotated under control of its own actuator system to change the angle of incidence 562 of the light beam 110A impinging upon the diffractive surface 502 of the grating 500. In this way, the mirror can be used to adjust the wavelength of the light beam 110A without unwanted changes to the optical magnification 565 or the bandwidth of the light beam 110A.

Figure 6A:
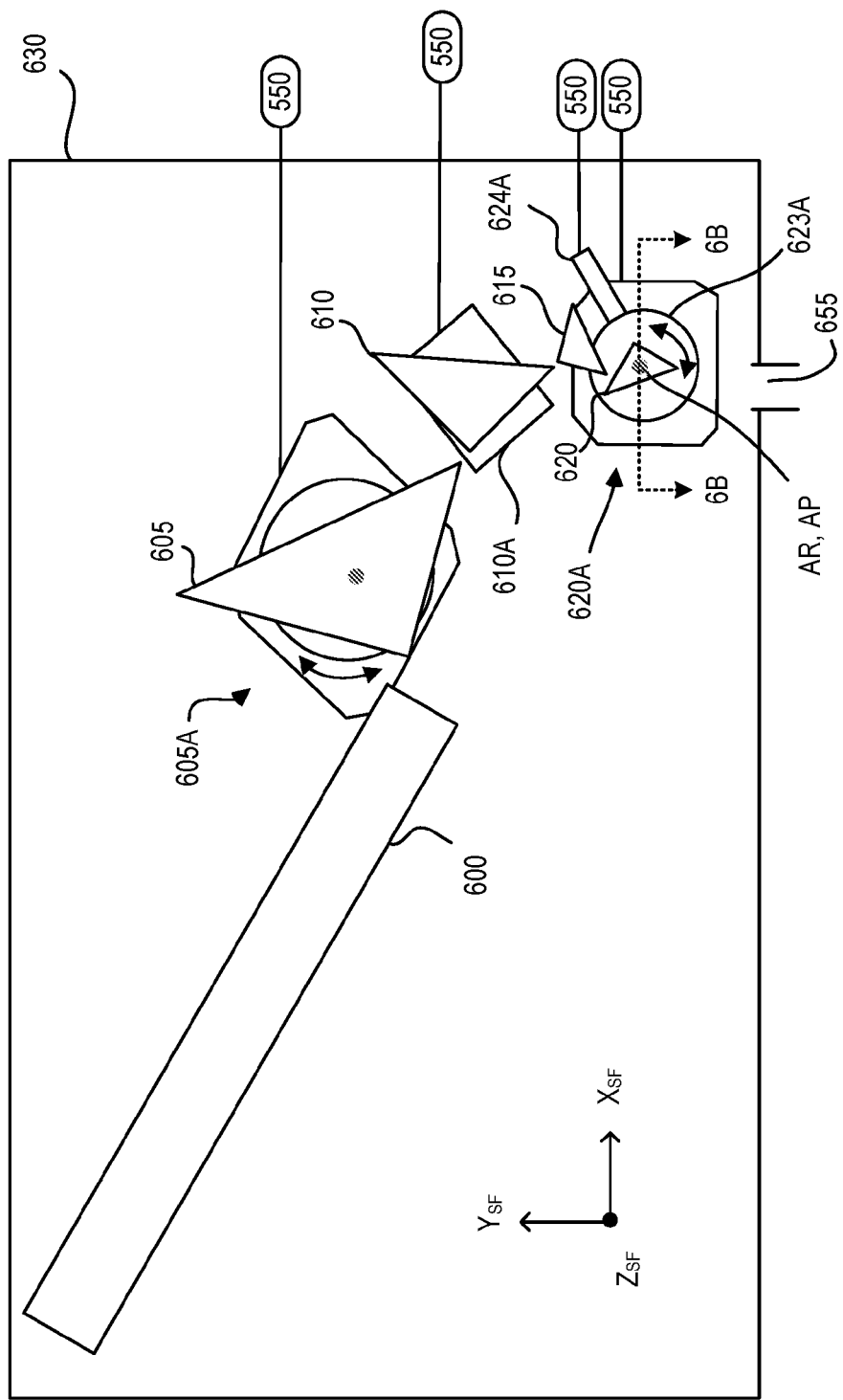
FIG. 6A is a block diagram of exemplary spectral feature selection apparatus that includes a rapid actuator associated with at least one of the prisms and can be used in the photolithography system of FIG. 1.

Referring to FIGS. 6A and 6B, in a first implementation, a spectral feature selection apparatus 630 is designed with a grating 600 and four prisms 605, 610, 615, 620. The grating 600 and the four prisms 605, 610, 615, 620 are configured to interact with the light beam 110A produced by the optical source 105 after the light beam 110A passes through an aperture 655 of the apparatus 630. The light beam 110A travels along a path in an $X_{SF}$-$Y_{SF}$ plane of the apparatus 630 from the aperture 655, through the prism 620, the prism 615, the prism 610, the prism 605, and then is reflected from the grating 600, and back through the prisms 605, 610, 615, 620 before exiting the apparatus through the aperture 655.

The prisms 605, 610, 615, 620 are right-angled prisms through which the pulsed light beam 110A is transmitted so that the pulsed light beam 110A changes its optical magnification as it passes through each right-angled prism. The right-angled prism 620 that is farthest from the dispersive optical element 600 has the smallest hypotenuse of the plurality, and each consecutive right-angled prism closer to the dispersive optical element 600 has a larger or same size hypotenuse than the adjacent right-angled prism that is farther from the dispersive optical element.

For example, the prism 605 that is closest to the grating 600 is also the largest in size, for example, its hypotenuse has the largest extent of the four prisms 605, 610, 615, 620. The prism 620 that is farthest from the grating 600 is also the smallest in size, for example, its hypotenuse has the smallest extent of the four prisms 605, 610, 615, 620. It is possible for adjacent prisms to be the same size. But, each prism that is closer to the grating 600 should be at least as large or greater than in size its adjacent prism because the light beam 110A is optically magnified as travels through the prism 620, the prism 615, the prism 610, and the prism 605, and thus the transverse extent of the light beam 110A enlarges as the light beam 110A gets closer to the grating 600. The transverse extent of the light beam 110A is the extent along the plane that is perpendicular to the propagation direction of the light beam 110A. And, the propagation direction of the light beam 110A is in the $X_{SF}$-$Y_{SF}$ plane of the apparatus 630.

The prism 605 is physically coupled to an actuation system 605A that rotates the prism 605 about an axis that is parallel with the $Z_{SF}$ axis of the apparatus 630, the prism 610 is physically coupled to an actuation system 610A that rotates the prism 610 about an axis that is parallel with the $Z_{SF}$ axis, and the prism 620 is physically coupled to a rapid actuation system 620A. The rapid actuation system 620A is configured to rotate the prism 605 about an axis that is parallel with the $Z_{SF}$ axis of the apparatus 630.

The rapid actuation system 620A includes a rotary stepper motor 621A that has a rotation shaft 622A and rotation plate 623A fixed to the rotation shaft 622A. The rotation shaft 622A and therefore the rotation plate 623A rotate about a shaft axis AR that is parallel with a center of mass (that corresponds to a rotation axis AP) of the prism 620 and is also parallel with the $Z_{SF}$ axis of the apparatus 630. Although not necessary, the shaft axis AR of the prism 620 can correspond with or align with the center of mass (the rotation axis AP) of the prism 620 along the $X_{SF}$-$Y_{SF}$ plane. In some implementations, the center of mass (or rotation axis AP) of the prism 620 is offset from the shaft axis AR along the $X_{SF}$-$Y_{SF}$ plane. By offsetting the shaft axis AR from the prism 620 center of mass, the position of the light beam 110A can be adjusted to be at a particular position on the surface of the grating 600 whenever the prism 620 is rotated.

By mounting the prism 620 to the rotation plate 623A, the prism 620 is directly rotated about its rotation axis AP as the shaft 622A and rotation plate 623A are rotated about their shaft axis AR. In this way, rapid rotation or control of the prism 620 is enabled when compared with a system that uses a linear stepper motor having a linearly translatable shaft (that is converted into a rotational motion using a flexure). Because a rotational step of the shaft 622A (and plate 623A) directly correlates to a rotational step of the prism 620 (without the imparting any a linear motion), the rotary stepper motor 621A is able to rotate the prism 620 at a speed that enables more rapid adjustment of spectral features (such as the bandwidth) of the light beam 110A and therefore the light beam 110. The rotary design of the stepper motor 621A imparts a purely rotational motion to the prism 620, which is mounted without the use of any linear motion or flexure motion that are found on prior actuators for the prism 620. Moreover, the use of a rotary shaft 622A enables the prism 620 to be rotated about a full 360°, unlike the prior actuator that used a linear stepper motor plus a flexure design (in which the prism 620 could only be rotated about the angle determined from the flexure). In some implementations, in order to achieve a tuning of the bandwidth of the light beam 110A in an acceptable range, the prism 620 is capable of being rotated by 15 degrees. The prism 620 can be rotated by larger than 15 degrees though it is not necessary with the current bandwidth range requirements.

In some implementations, the stepper motor 621A can by a direct drive stepper motor. A direct drive stepper motor is a conventional electromagnetic motor that uses a built-in step motor functionality for position control. In other implementations in which a higher resolution in motion may be needed, the stepper motor 621A can use a piezoelectric motor technology.

The stepper motor 621A can be, for example, a rotary stage that is controlled with a motor controller using a variable-frequency drive control method to provide the rapid rotation of the prism 620.

As discussed above, the advantage of using a rotary stepper motor 621A is to obtain more rapid rotation of the prism 620 because the rotation axis AP of the prism 620 is parallel with the rotational shaft 622A and also the shaft axis AR. Thus, for every unit rotation of the shaft 622A, the prism 620 rotates by an incremental unit and the prism 620 rotates as fast as the rotational shaft 622A can rotate. In some implementations, in order to increase the stability of this configuration, and increase the stability of the prism 620, the rapid actuation system 620A includes a position monitor 624A that is configured to detect a position of the rotational shaft 622A of the rotary stepper motor 621A. The error between the measured position of the rotational shaft 622A and the expected or target position of the rotational shaft 622A correlates directly with the error in the position of the prism 620 and thus, this measurement can be used to determine the rotational error of the prism 620 (that is, the difference between actual rotation and commanded rotation) and to correct for this error during operation.

The control module 550 is connected to the position monitor 624A to receive the value of the position of the rotational shaft 622A and the control module 550 is also able to access a stored or current value of the commanded position of the rotational shaft 622A so that the control module 550 can perform the calculation to determine the difference between the measured value of the position and the commanded position of the rotational shaft 622A and also determine how to adjust the rotational shaft 622A to reduce this error. For example, the control module 550 can determine a size of rotation as well as a direction of rotation of the rotational shaft 622A to offset the error. Alternatively, it is possible for the control system 185 to perform this analysis.

The position monitor 624A can be a very high resolution optical rotary encoder that is built integrally with the rotational plate 623A. The optical rotary encoder uses optical sensing technology and on the rotation of an internal code disc that has opaque lines and patterns on it. For example, the plate 623A is rotated (hence the name rotary encoder) in a beam of light such as a light emitting diode and the markings on the plate 623A act as shutters blocking and unblocking the light. An internal photodiode detector senses the alternating light beam and the encoder's electronics convert the pattern into an electrical signal that is then passed on to the control module 550 through the output of the encoder 624A.

In some implementations, the control module 550 can be designed with a rapid internal dedicated controller solely for operating the rotary stepper motor 621A. For example, the rapid internal dedicated controller can receive the high resolution position data from the encoder 624A and can send a signal directly to the rotary stepper motor 621A to adjust the position of the shaft 622A and thereby adjust the position of the prism 620.

Referring also to FIG. 6C, the illumination system 150 changes a spectral feature such as the bandwidth of the light beam 110A under control of the control system 185, which interfaces with the control module 550. For example, in order to coarsely and broadly control the bandwidth of the light beam 110A and the light beam 110, the control module 550 sends a signal to the rotary stepper motor 621A of the rapid actuation system 620A to rotate the rotational shaft 622A from a first angle θ1 (on the left side of FIG. 6C) to a second angle θ2 (where Δθ=θ2−θ1) (on the right side of FIG. 6C). And, this change of angle of the shaft 622A is directly imparted to the plate 623A, which is fixed to the shaft 622A, and thereby also imparted to the prism 620, which is fixed to the plate 623A. The rotation of the prism 620 from θ1 to θ2 causes a corresponding change in the optical magnification OM 565 of the pulsed light beam 110A that interacts with the grating 600 from OM1 to OM2, and the change in the optical magnification 565 of the pulsed light beam 110A causes a change in the bandwidth of the pulsed light beam 110A (and the light beam 110 as well). The range of the bandwidth that can be achieved by rotating the prism 620 using this rapid actuation system 620A can be a broad range and can be from about 100 femtometers (fm) to about 450 fm. The overall bandwidth range achievable can be at least 250 fm.

The rotation of the prism 620 associated with the rapid actuation system 620A by one unit of rotation of the rotational shaft 622A causes the bandwidth of the pulsed light beam 110A to change by an amount that is less than a resolution of a bandwidth measurement device (for example, as a part of the measurement system 170, which is discussed below) that measures the bandwidth of the pulsed light beam 110. The prism 620 can be rotated by up to 15 degrees to achieve such a change in bandwidth. In practice, the amount of rotation of the prism 620 is constrained only by the optical layout of the other components of the apparatus 630. For example, a rotation that is too large could cause the light beam 110A to be displaced by an amount that is so large that the light beam 110A does not impinge upon the next prism 615. In some implementations, in order to achieve a tuning of the bandwidth of the light beam 110A in an acceptable range, the prism 620 is capable of being rotated by 15 degrees, without risk of the light beam 110A walking off any of the other prisms 605, 610, or 615. The prism 620 can be rotated by larger than 15 degrees though it is not necessary with the current bandwidth range requirements.

Referring again to FIG. 6A, the prism 610 can be mounted to an actuation system 610A that causes the prism 410 to rotate, and such rotation of the prism 610 can provide for fine control of the wavelength of the light beam 110A. The actuation system 610A can include a rotary stepper motor that is controlled with a piezoelectric motor. The piezoelectric motor operates by making use of the converse piezoelectric effect in which a material produces acoustic or ultrasonic vibrations in order to produce a linear or rotary motion.

Alternatively, the prism 610 can be mounted to a rapid actuation system 610A that includes a rotary stepper motor (like the rotary stepper motor 621A that has a rotation shaft 622A and rotation plate 623A fixed to the rotation shaft 622A). The rotation shaft and therefore the rotation plate rotate about a shaft axis that is parallel with a center of mass (that corresponds to a rotation axis AP) of the prism 610 and is also parallel with the $Z_{SF}$ axis of the apparatus 630. In this way, the rotation of the prism 610 can provide for more fine control of the bandwidth of the light beam 110A.

The prism 615 that is closer to the grating 600, and has a size that is either larger than or equal to the size of the prism 620, can be fixed in space in some implementations. The next prism 610 that is closer to the grating 600 has a size that is either larger than or equal to the size of the prism 615.

The prism 605 that is closest to the grating 610 has a size that is either larger than or equal to the size of the prism 610 (the prism 605 is the largest prism of the beam expander). The prism 605 can be mounted to an actuation system 605A that causes the prism 605 to rotate and such rotation of the prism 605 can provide for coarse control of the wavelength of the light beam 110A. For example, the prism 605 can be rotated by 1-2 degrees to tune the wavelength of the light beam 110A (and thus the light beam 110) from about 193.2 nanometers (nm) to about 193.5 nm. In some implementations, the actuation system 605A includes a rotary stepper motor that includes a mounting surface (such as the plate 623A) to which the prism 605 is fixed and a motor shaft that rotates the mounting surface. The motor of the actuation system 605A can be a piezoelectric motor that is fifty times faster than a prior linear stepper motor and flexure combination design. Like the actuation system 620A, the actuation system 605A can include an optical rotary encoder that provides angular position feedback for the control system 185 or the control module 650.

Figure 7A:
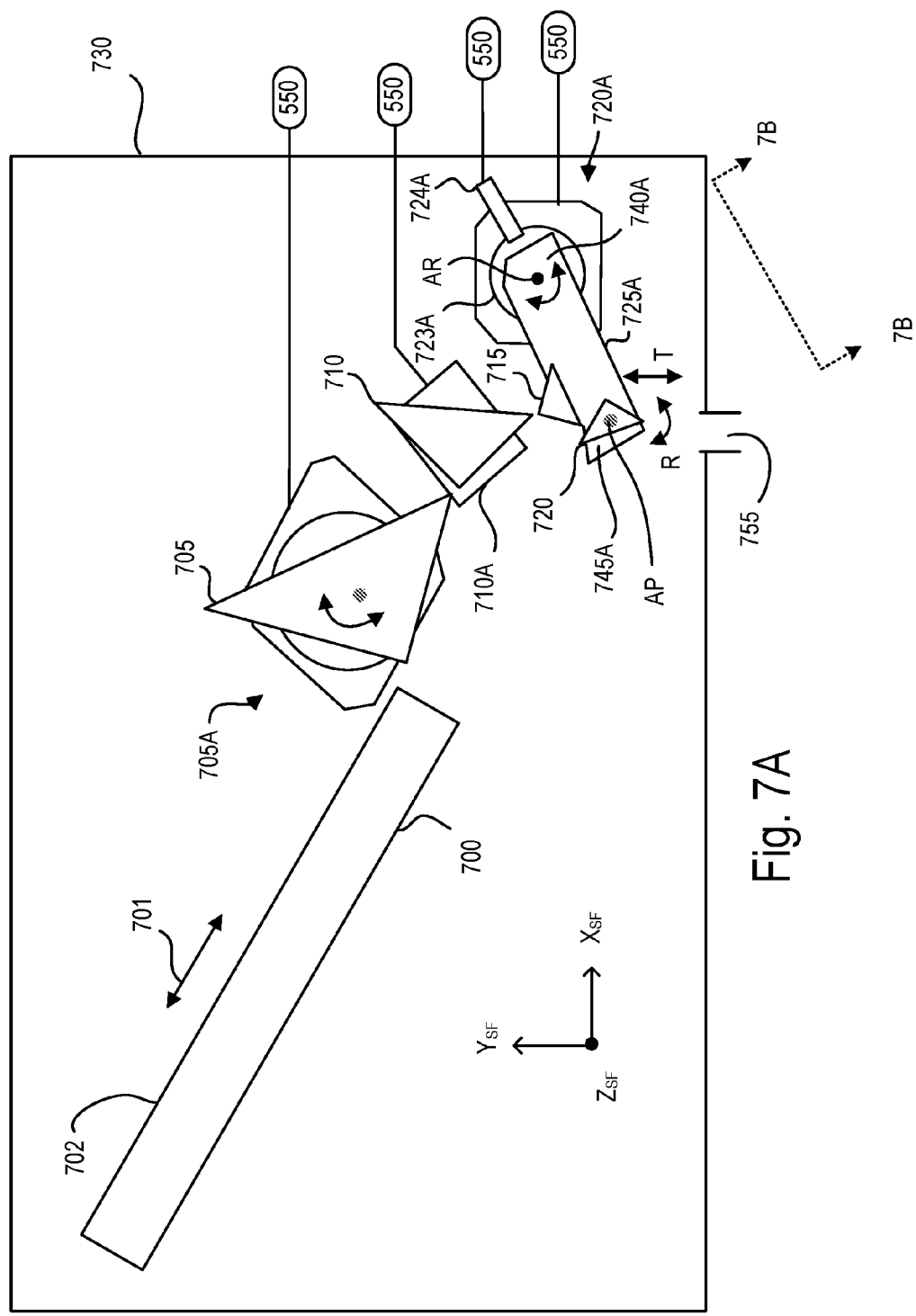
FIG. 7A is a block diagram of exemplary spectral feature selection apparatus that includes a rapid actuator associated with at least one of the prisms and can be used in the photolithography system of FIG. 1.

Referring to FIGS. 7A and 7B, in another implementation of the spectral feature selection apparatus 730, a rapid actuation system 720A is designed to rotate R the prism 720 of a beam expander that is farthest from the grating 700 about the shaft axis AR. Optionally or additionally, the actuation system 710A associated with the prism 710 can also be a rapid actuation system that is designed like the rapid actuation system 720A or 620A.

The apparatus 730 includes an extending arm 725A that has a first region 740A that is mechanically linked to the rotational plate 723A at the location of the shaft axis AR. The extending arm 725A has a second region 745A that is offset from the shaft axis AR along a direction in the $X_{SF}$-$Y_{SF}$ plane (and thus along a direction that is perpendicular to the shaft axis AR) so that the second region 745A is not intersected by the shaft axis AR. The prism 720 is mechanically linked to the second region 745A.

Both the center of mass (the prism axis AP) of the prism 720 and the shaft axis AR remain parallel with the $Z_{SF}$ axis of the apparatus 730; however, the center of mass of the prism 720 is offset from the shaft axis AR. A rotation of the extending arm 725A about the shaft axis AR by an angle Δθ imparts a combined movement to the prism 720: a rotation R of the prism 720 about the shaft axis AR by an angle Δθ (see FIG. 5C) within the $X_{SF}$-$Y_{SF}$ plane, and a linear translation T to the prism 720 along a direction that lies within the $X_{SF}$-$Y_{SF}$ plane of the apparatus 730. In the example of FIG. 7C, the prism 720 is rotated R from a first angle θ1 to a second angle θ2 and is translated T from a first position Pos1 in the $X_{SF}$-$Y_{SF}$ plane to a second position Pos2 in the $X_{SF}$-$Y_{SF}$ plane.

The linear translation T to the prism 720 thereby translates the light beam 110A along a direction that is parallel with the longer axis 701 of the surface 702 of the grating 700. The longer axis 701 also lies along the $X_{SF}$-$Y_{SF}$ plane of the apparatus 730. By performing this translation of the light beam 110A, it is possible to control which area or region of the grating 700 is illuminated at the lower end of the range of possible optical magnifications OM. Moreover, the grating 700 and the surface 702 of the grating is non-uniform; namely, some regions of the surface 702 of the grating 700 impart a different change to the wavefront of the light beam 110A than other regions of the surface 702 of the grating 700 and some regions of the surface 702 impart more distortion to the wavefront of the light beam 110A than other regions of the surface 702. The control system 185 (or control module 550) can control the rapid actuation system 720A to thereby adjust the linear translation T to the prism 720 and adjust the translation of the light beam 110A along the longer axis 701 to take advantage of the non-uniformity of the grating 700 surface 702 and illuminate a higher distortion region of the grating surface 702 near one end of the grating surface 702 to raise the spectral bandwidth even more than the effect of simply lowering the optical magnification would achieve.

Additionally, the linear translation T to the prism 720 also translates the hypotenuse H (see FIG. 7C) of the prism 720 during rotation of the prism 720 relative to the location of the light beam 110A. The translation to the hypotenuse H therefore exposes new regions of the hypotenuse H to the light beam 110A during operation of the apparatus 730. Over the lifetime of the apparatus 730, the prism 720 is rotated from one end of its rotation range to the other end and also more regions are exposed to the light beam 110A, which reduces the amount of damage imparted to the prism 720 by the light beam 110A.

Similar to the apparatus 630, the spectral feature selection apparatus 730 also includes a grating 600, and the beam expander includes the prisms 705, 710, 715, which are positioned along the path of the light beam 110A between the prism 720 and the grating 700. The grating 700 and the four prisms 705, 710, 715, 720 are configured to interact with the light beam 110A produced by the optical source 105 after the light beam 110A passes through an aperture 755 of the apparatus 730. The light beam 110A travels along a path in the $X_{SF}$-$Y_{SF}$ plane of the apparatus 730 from the aperture 755, through the prism 720, the prism 715, the prism 710, the prism 705, and then is reflected from the grating 700, and back through the consecutive prisms 705, 710, 715, 720 before exiting the apparatus 730 through the aperture 755.

Referring to FIGS. 8A-8D, in other implementations, a rapid actuation system 820A is designed like the rapid actuation system 720A but with an added secondary actuator 860A. The secondary actuator 860A is physically coupled to the prism 820 that is farthest from the grating 800. The secondary actuator 860A is configured to rotate the prism 820 about an axis AH that lies in the $X_{SF}$-$Y_{SF}$ plane and also lies in the plane of a hypotenuse H of the prism 820.

In some implementations, although not required the secondary actuator 860A is controlled by the control module 650 (or the control system 185). The secondary actuator 860A can be a manual screw and flexure design that is not controlled by the control module 550 or the control system 185. For example, the actuator 860A could be set before the system 820A is used or periodically can be changed manually in between uses of the system 820A.

The prism 820 can therefore be rotated about the axis AH that lies in the $X_{SF}$-$Y_{SF}$ plane to enable greater control over where the light beam 110A enters the prism 820 and the hypotenuse H of the prism 820 in order to better maintain the path of the light beam 110A through each of the prisms 815, 810, 805, and the grating 800. Specifically, rotation of the prism 820 about the axis AH enables the light beam 110A to be more finely adjusted. For example, the prism 820 can be rotated about the axis AH to ensure that the retro-reflected (that is, diffracted) light beam 110A from the grating 800 remains in the $X_{SF}$-$Y_{SF}$ plane and is not displaced along the $Z_{SF}$ axis of the apparatus 830 even if the prism 820 is rotated about the AP or AR axis. It is beneficial to have this $Z_{SF}$ axis adjustment if the AP or AR axis is not perfectly aligned with the $Z_{SF}$ axis. Additionally, it can be beneficial to rotate the prism 820 about the AH axis because the extending arm 825A is a cantilever and it can sag or move in a manner along the $Z_{SF}$ axis such that it deflects about the axis AH and the secondary actuator 860A can be used to offset this deflection.

Figure 9:
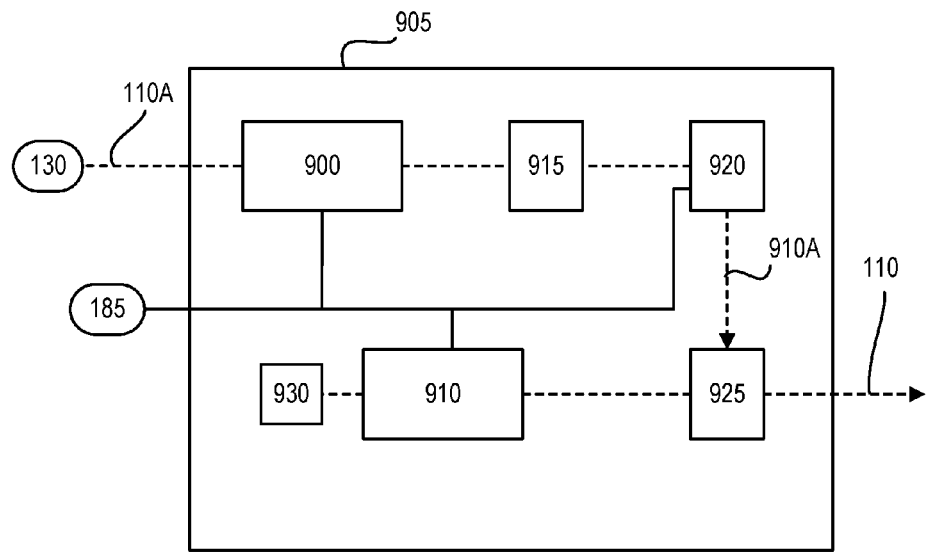
FIG. 9 is a block diagram of an exemplary optical source that can be used in the photolithography system of FIG. 1.

Referring to FIG. 9, an exemplary optical source 905 is a pulsed laser source that produces a pulsed laser beam as the light beam 110. The optical source 905 is a two-stage laser system that includes a master oscillator (MO) 900 that provides the seed light beam 110A to a power amplifier (PA) 910. The master oscillator 900 typically includes a gain medium in which amplification occurs and an optical feedback mechanism such as an optical resonator. The power amplifier 910 typically includes a gain medium in which amplification occurs when seeded with the seed laser beam from the master oscillator 900. If the power amplifier 910 is designed as a regenerative ring resonator then it is described as a power ring amplifier (PRA) and in this case, enough optical feedback can be provided from the ring design. The spectral feature selection apparatus 130 receives the light beam 110A from the master oscillator 900 to enable fine tuning of spectral parameters such as the center wavelength and the bandwidth of the light beam 110A at relatively low output pulse energies. The power amplifier 910 receives the light beam 110A from the master oscillator 900 and amplifies this output to attain the necessary power for output to use in photolithography.

The master oscillator 900 includes a discharge chamber having two elongated electrodes, a laser gas that serves as the gain medium, and a fan circulating the gas between the electrodes. A laser resonator is formed between the spectral feature selection apparatus 130 on one side of the discharge chamber, and an output coupler 915 on a second side of the discharge chamber to output the seed light beam 110A to the power amplifier 910.

The optical source 905 can also include a line center analysis module (LAM) 920 that receives an output from the output coupler 915, and one or more beam modification optical systems 925 that modify the size and/or shape of the beam as needed. The line center analysis module 920 is an example of one type of measurement system within the measurement system 170 that can be used to measure the wavelength (for example, the center wavelength) of the seed light beam.

The power amplifier 910 includes a power amplifier discharge chamber, and if it is a regenerative ring amplifier, the power amplifier also includes a beam reflector or beam turning device 930 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 110A is amplified by repeatedly passing through the power amplifier 910. The beam modification optical system 925 provides a way (for example, a partially-reflecting mirror) to in-couple the seed light beam 110A and to out-couple a portion of the amplified radiation from the power amplifier to form the output light beam 110.

The laser gas used in the discharge chambers of the master oscillator 900 and the power amplifier 910 can be any suitable gas for producing a laser beam around the required wavelengths and bandwidth. For example, the laser gas can be argon fluoride (ArF), which emits light at a wavelength of about 193 nm, or krypton fluoride (KrF), which emits light at a wavelength of about 248 nm.

The line center analysis module 920 monitors the wavelength of the output (the light beam 110A) of the master oscillator 900. The line center analysis module 920 can be placed at other locations within the optical source 905, or it can be placed at the output of the optical source 905.

The repetition rate of the pulses produced by the power amplifier 910 is determined by the repetition rate at which the master oscillator 900 is controlled by the control system 185, under the instructions from the controller 140 in the scanner 115. The repetition rate of the pulses output from the power amplifier 910 is the repetition rate seen by the scanner 115.

As discussed above, it is possible to control the bandwidth both coarsely and finely using only optical elements such as those in FIG. 5A. On the other hand, it is possible to control the bandwidth in a fine and narrow range, and rapidly, by controlling a differential timing between the activation of the electrodes within the MO 900 and the PRA 910 while controlling the bandwidth in a coarse and wide range by adjusting the angle of the prism 520 using the rapid actuation system 520A.

Figure 10:
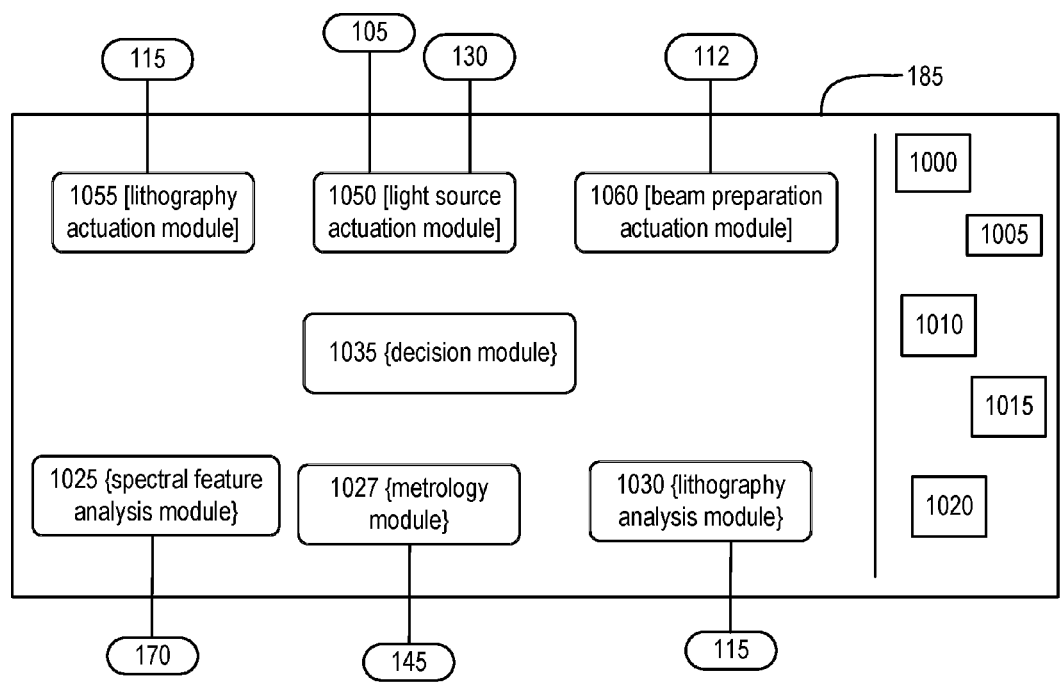
FIG. 10 is a block diagram of an exemplary control system that can be used in the photolithography system of FIG. 1.

Referring to FIG. 10, details about the control system 185 are provided that relate to the aspects of the system and method described herein. The control system 185 can include other features not shown in FIG. 10. In general, the control system 185 includes one or more of digital electronic circuitry, computer hardware, firmware, and software.

The control system 185 includes memory 1000, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 185 can also include one or more input devices 1005 (such as a keyboard, touch screen, microphone, mouse, hand-held input device, etc.) and one or more output devices 1010 (such as a speaker or a monitor).

The control system 185 includes one or more programmable processors 1015, and one or more computer program products 1020 tangibly embodied in a machine-readable storage device for execution by a programmable processor (such as the processors 1015). The one or more programmable processors 1015 can each execute a program of instructions to perform desired functions by operating on input data and generating appropriate output. Generally, the processor 1015 receives instructions and data from memory 1000. Any of the foregoing may be supplemented by, or incorporated in, specially designed ASICs (application-specific integrated circuits).

The control system 185 includes, among other components, a spectral feature analysis module 1025, a metrology module 1027, a lithography analysis module 1030, a decision module 1035, a light source actuation module 1050, a lithography actuation module 1055, and a beam preparation actuation module 1060. Each of these modules can be a set of computer program products executed by one or more processors such as the processors 1015. Moreover, any of the modules 1025, 1030, 1035, 1050, 1055, 1060 can access data stored within the memory 1000.

The spectral feature analysis module 1025 receives the output from the measurement system 170. The metrology module 1027 receives the data from the metrology apparatus 145. The lithography analysis module 1030 receives information from the lithography controller 140 of the scanner 115. The decision module 1035 receives the outputs from the analyses modules (such as the modules 1025, 1027, and 1030) and determines which actuation module or modules need to be activated based on the outputs from the analyses modules. The light source actuation module 1050 is connected to one or more of the optical source 105 and the spectral feature selection apparatus 130. The lithography actuation module 1055 is connected to the scanner 115, and specifically to the lithography controller 140. The beam preparation actuation module 1060 is connected to one or more components of the beam preparation system 112.

While only a few modules are shown in FIG. 10, it is possible for the control system 185 to include other modules. Additionally, although the control system 185 is represented as a box in which all of the components appear to be co-located, it is possible for the control system 185 to be made up of components that are physically remote from each other. For example, the light source actuation module 1050 can be physically co-located with the optical source 105 or the spectral feature selection apparatus 130.

In general, the control system 185 receives at least some information about the light beam 110 from the measurement system 170, and the spectral feature analysis module 1025 performs an analysis on the information to determine how to adjust one or more spectral features (for example, the bandwidth) of the light beam 110 supplied to the scanner 115. Based on this determination, the control system 185 sends signals to the spectral feature selection apparatus 130 and/or the optical source 105 to control operation of the optical source 105 via the control module 550. In general, the spectral feature analysis module 1025 performs the analysis needed to estimate one or more spectral features (for example, the wavelength and/or the bandwidth) of the light beam 110. The output of the spectral feature analysis module 1025 is an estimated value of the spectral feature that is sent to the decision module 1035.

The spectral feature analysis module 1025 includes a comparison block connected to receive the estimated spectral feature and also connected to receive a spectral feature target value. In general, the comparison block outputs a spectral feature error value that represents a difference between the spectral feature target value and the estimated value. The decision module 1035 receives the spectral feature error value and determines how best to effect a correction to the system 100 in order to adjust the spectral feature. Thus, the decision module 1035 sends a signal to the light source actuation module 1050, which determines how to adjust the spectral feature selection apparatus 130 (or the optical source 105) based on the spectral feature error value. The output of the light source actuation module 1050 includes a set of actuator commands that are sent to the spectral feature selection apparatus 130. For example, light source actuation module 1050 sends the commands to the control module 550, which is connected to the actuation systems within the apparatus 530.

Additionally, the lithography analysis module 1030 can receive instructions from the lithography controller 140 of the scanner 115 for example, to change one or more spectral features of the pulsed light beam 110 or to change a pulse repetition rate of the light beam 110. The lithography analysis module 1030 performs an analysis on these instructions to determine how to adjust the spectral features and sends the results of the analysis to the decision module 1035. The control system 185 causes the optical source 105 to operate at a given repetition rate. More specifically, the scanner 115 sends a trigger signal to the optical source 105 (by way of the control system (through the lithography analysis module 1030) for every pulse (that is, on a pulse-to-pulse basis) and the time interval between those trigger signals can be arbitrary, but when the scanner 115 sends trigger signals at regular intervals then the rate of those signals is a repetition rate. The repetition rate can be a rate requested by the scanner 115.

Figure 11:
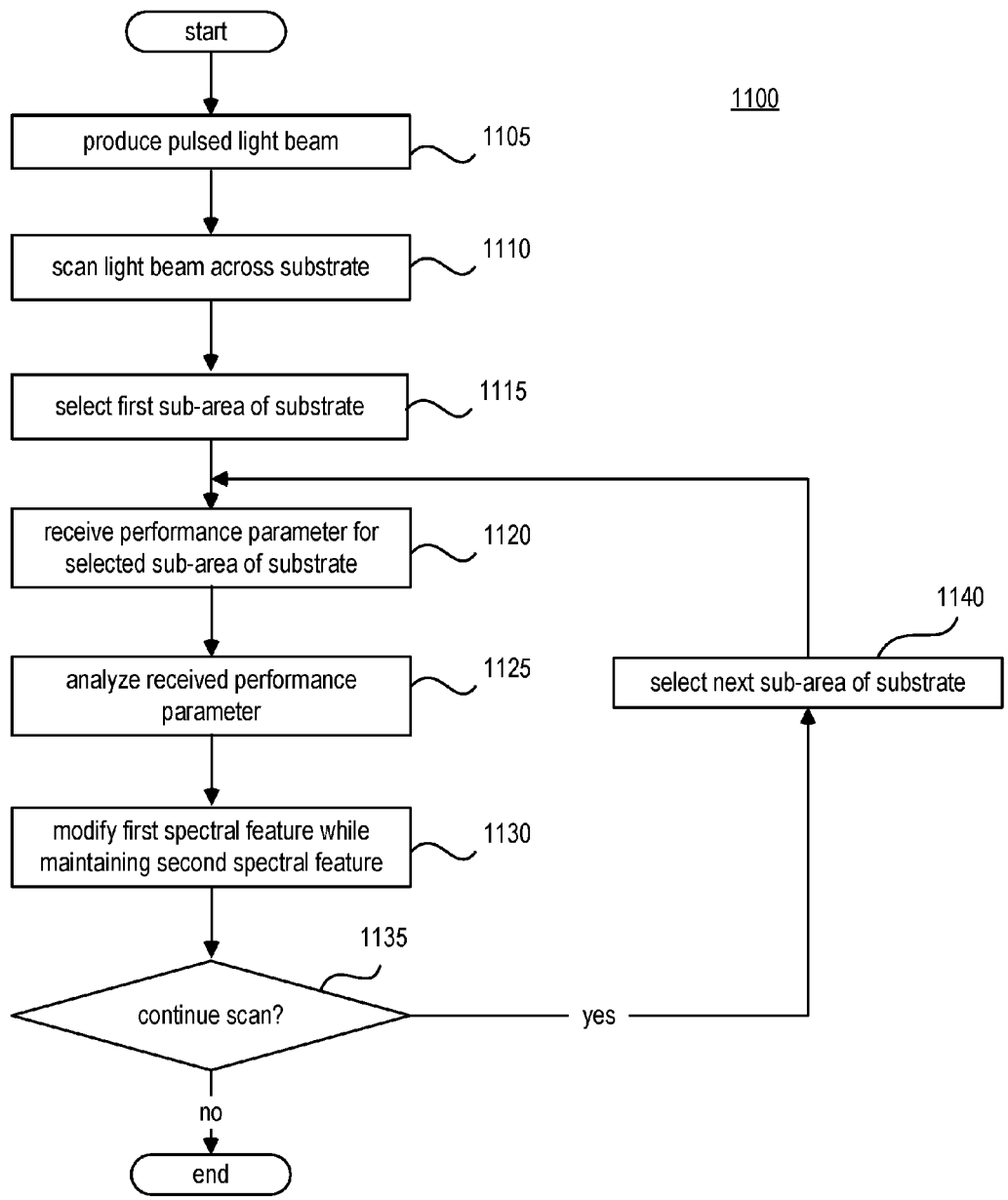
FIG. 11 is a flow chart of an exemplary procedure performed by the photolithography system of FIG. 1 to rapidly and independently control at least two spectral features of the pulsed light beam to compensate for a variation in characteristics at the wafer in each sub-area of the wafer.

Referring to FIG. 11, a procedure 1100 is performed by the photolithography system 100 to rapidly and independently control at least two spectral features of the pulsed light beam 110 to compensate for a variation in one or more lithography performance parameters at each sub-area of the wafer 120. The independent control of the at least two spectral features means that if a first spectral feature should be adjusted for a particular sub-area of the wafer 120, and the second spectral feature should be maintained for that particular sub-area of the wafer 120, then the procedure 1100 takes the steps needed to maintain the second spectral feature within an acceptable range and it does this for each sub-area of the wafer 120. Thus, the first spectral feature and the second spectral feature reach a stable value after any adjustments are needed in a particular sub-area of the wafer 120 and before the next sub-area of the wafer 120 is analyzed. This rapid analysis and adjustment takes place for each sub-area of the wafer 120 because the spectral feature selection system 130 has been redesigned to provide for more rapid adjustments to the spectral features of the pulsed light beam 110. The procedure 1100 can be performed by the control system 185.

The pulsed light beam 110 is produced (1105) for example, by the optical source 105. The pulsed light beam 110 can be produced (1105) by directing seed light beam 110A through the spectral feature selection system 130.

For example, the pulsed light beam 110 can be produced from the optical source 905 by generating a first pulsed light beam 910A from a first gas discharge stage (such as the master oscillator 900) including selecting the first spectral feature of the pulsed light beam 910A; directing the first pulsed light beam 910A to a second gas discharge stage (such as the power amplifier 910); and amplifying the first pulsed light beam in the second gas discharge stage to thereby produce the pulsed light beam 910 from the optical source 905.

The pulsed light beam 110 is directed toward the wafer 120, which is mounted to the stage 122 of the scanner 115. For example, the pulsed light beam 110 produced by the optical source 105 is modified, as needed, and redirected by the beam preparation system 112 toward the scanner 115.

The pulsed light beam 110 is scanned across the wafer 120 (1110), for example, by moving the pulsed light beam 110 and the wafer 120 relative to each other along the lateral plane (the $X_L$-$Y_L$ plane). Specifically, the lithography controller 140 can send one or more signals to the actuation systems associated with the wafer stage 122, the mask 134, and the objective arrangement 132 to thereby move one or more of the mask 134, the objective arrangement 132, and the wafer 120 (via the stage 122) relative to each other during the exposure to scan the exposure window 400 across each sub-area (for each exposure field 223) of the wafer 220.

A first sub-area of the wafer 120 is selected for exposure (1115) by the light beam 110 for lithographic processing.

The sub-area of the wafer 120 that is selected can be an exposure field (such as the exposure field 223 of the wafer 220). Or, the sub-area of the wafer 120 can correspond to that portion of the wafer 120 that interacts with a single pulse of the light beam 110.

The lithography performance parameter at the wafer 120 for that selected sub-area of a wafer 120 is received (1120). For example, the control system 185 receives the performance parameter for the sub-area of the wafer 120 from the lithography controller 140, which receives the data from the metrology apparatus 145. The performance parameter at the wafer 120 can be received (1120) at each sub-area of the wafer 120 while scanning the pulsed light beam 110 across the wafer 120 or it can be received prior to scanning the pulsed light beam 110 across the wafer 120.

The performance parameter that is received (1120) can be one or more of an error in a physical property of the wafer, a contrast of a feature formed on the wafer, a critical dimension at sub-area exposed to the pulsed light beam 110, a placement (X,Y location relative to desired/target location) of a feature formed on the wafer 120 relative to a target or relative to an underlying feature (for example, an overlay), a photoresist profile, a side-wall angle, and a change in position of the wafer 120.

The control system 185 analyzes the received lithography performance parameter (1125), for example, to determine whether it is outside an acceptable range of values. If the lithography performance parameter is outside an acceptable range of values (1125), then the control system 185 determines how to modify a first spectral feature of the light beam 110 in order to compensate for the unacceptable variation in the lithography performance parameter in that sub-area of the wafer 120. The control system 185 sends a signal to the spectral feature selection apparatus 130 to change the first spectral feature of the light beam 110 (1130) by an amount that would compensate for the unacceptable variation in the lithography performance parameter.

Moreover, the control system 185 also analyzes whether the modification to the first spectral feature of the light beam 110 impacts the value of the second spectral feature of the light beam 110 and acts in a manner that would maintain the second spectral feature of the light beam 110 within an acceptable range. For example, the control system 185 may determine that the second spectral feature of the light beam 110 needs to be changed to offset an unwanted modification to the second spectral feature of the light beam 110 caused by the modification to the first spectral feature of the light beam 110. The control system 185 therefore sends a signal to the spectral feature selection apparatus 130 to change the second spectral feature of the light beam (1130) by an amount that would compensate for this unwanted modification.

The control system 185 determines whether additional sub-areas of the wafer 120 need to be exposed (1135) by the light beam 110 for lithographic processing, and if additional sub-areas of the wafer 120 need to be exposed (1135), then the control system 185 selects a next sub-area of the wafer 120 (1140) as the sub-area to be exposed by the light beam 110 for lithographic processing. Thus, the procedure 1100 continues until the entire wafer 120 has been processed.

Moreover, the procedure 1100 can modify the first spectral feature of the pulsed light beam 110 (1130) by selectively reflecting the pulsed light beam 110A from a diffractive surface (such as the surface 502) of the spectral feature selection system 130.

The first spectral feature of the pulsed light beam can be modified (1130) and the second spectral feature of the pulsed light beam can be maintained (113) by directing the pulsed light beam through a plurality of prisms (such as the prisms 505, 510, 515, 520) toward a diffractive optical element (such as the grating 500) so that the pulsed light beam retro reflects off the diffractive optical element and back through the plurality of prisms. Additionally, at least two prisms in the beam expander can be rotated so that an angle of incidence 562 of the pulsed light beam 110 on the diffractive optical element is changed but the total magnification 565 of the pulsed light beam on the diffractive optical element is unchanged.

The first spectral feature of the light beam 110 can be modified (1130) by modifying the wavelength of the pulsed light beam. Moreover, the second spectral feature can be maintained (1130) by maintaining the bandwidth of the pulsed light beam 110 to within a range of bandwidths. For example, the bandwidth of the pulsed light beam 110 can be maintained to within +/−10 femtometers (fm) or within +/−1 fm.

The first spectral feature of the pulsed light beam 110 can be modified (1130) by rotating a first prism system of the spectral feature selection apparatus 130 through which the pulsed light beam 110A passes. For example, the control system 185 can send a signal to the control module 550 of the spectral feature selection apparatus 130 of FIG. 5A to rotate one or more prisms of the beam expander 501. For example, the prism 505 can be rotated for relatively coarse wavelength modification and the prism 510 can be rotated for relatively fine wavelength modification. As another example, the prism 505 can be rotated for relatively coarse wavelength modification and the prism 515 can be rotated for relatively fine wavelength modification.

Moreover, the second spectral feature of the pulsed light beam 110 can be maintained (1130) by rotating a second prism system of the spectral feature selection apparatus 130 through which the pulsed light beam 110A passes. For example, the control system 185 can send a signal to the control module 550 of the spectral feature selection apparatus 130 of FIG. 5A to rotate one or more prisms of the beam expander 501. For example, the prism 520 can be rotated for relatively coarse bandwidth adjustment and the prism 510 can be rotated for relatively fine bandwidth adjustment using the rapid actuators discussed above.

A relatively coarse wavelength modification can be effected by an actuation step associated with that prism that is relatively larger than an actuation step used to provide a relatively fine wavelength modification. Similarly, a relatively coarse bandwidth adjustment can be effected by an actuation step associated with that prism that is relatively larger than an actuation step used to provide a relatively fine bandwidth modification.

The first spectral feature of the pulsed light beam 110 can be modified (1130) by rotating a mirror placed between the prism 505 and the grating 500 of the spectral feature selection apparatus 130 through which the pulsed light beam 110A passes. For example, the control system 185 can send a signal to the control module 550 of the spectral feature selection apparatus 130 of FIG. 5A to rotate the mirror.

The control system 185 can maintain the second spectral feature of the pulsed light beam 110 (1130) by adjusting the second spectral feature to compensate for changes of the first spectral feature due to the modification of the first spectral feature of the pulsed light beam 110 (1130). Moreover, the second spectral feature of the pulsed light beam 110 can be adjusted (1130) simultaneously with modifying the first spectral feature of the pulsed light beam 110 (1130).

The modification of the first spectral feature of the pulsed light beam 110 (1130) can cause a modification to a first condition of the pulsed light beam 110 at the wafer 120. For example, if the first spectral feature is the wavelength of the light beam 110, then modification of the wavelength causes a modification to a focal plane of the light beam 110 at the wafer 120. The maintaining of the second spectral feature of the pulsed light beam 110 (1130) can cause a second condition of the pulsed light beam 110 at the wafer 120 to be maintained at a particular level. For example, if the second spectral feature is the bandwidth of the light beam 110, then by maintaining the bandwidth of the light beam 110, a contrast attribute or depth of focus of the light beam 110 at the wafer 120 can thereby be maintained.

Figure 8A:
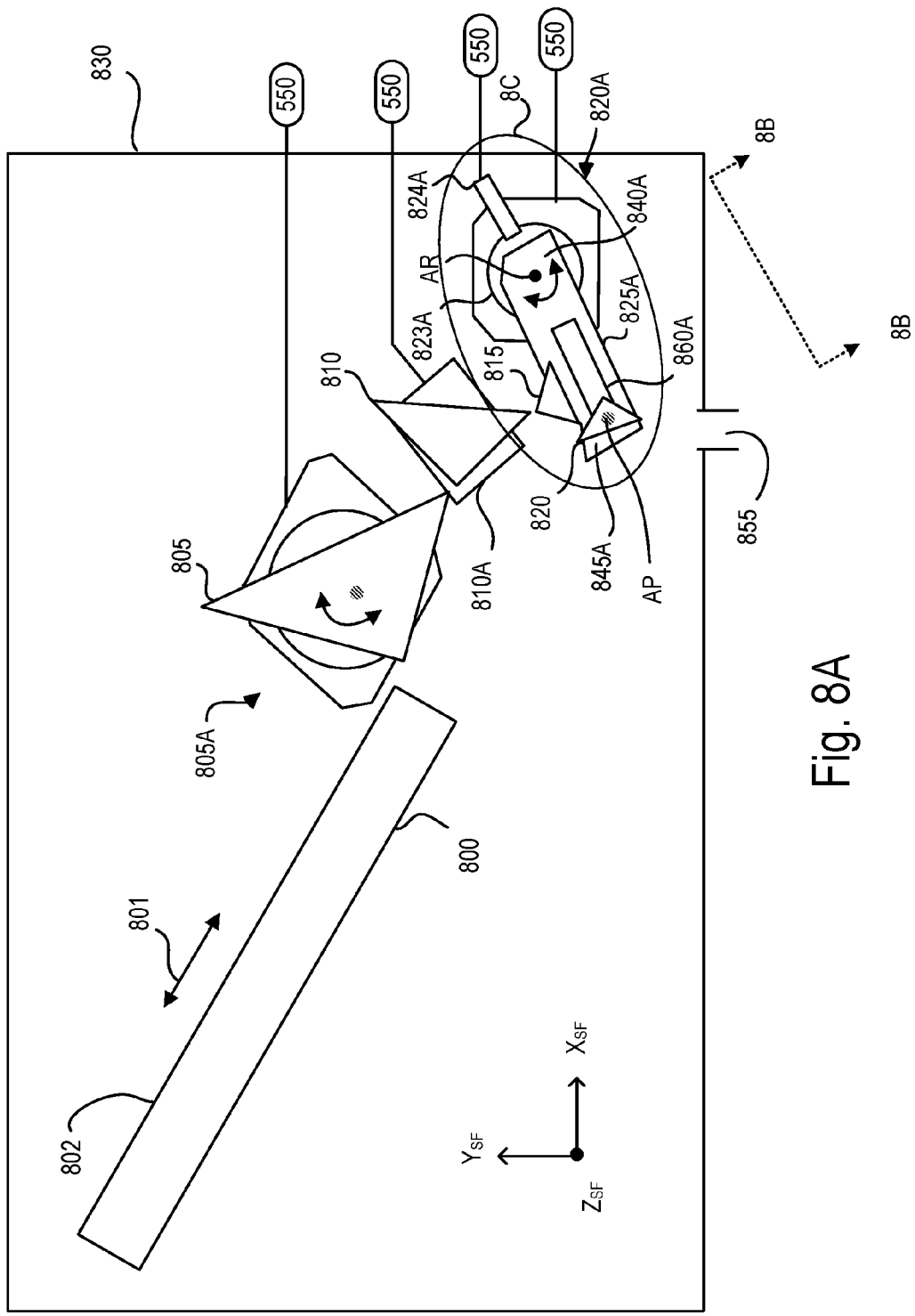
FIG. 8A is a block diagram of exemplary spectral feature selection apparatus that includes a rapid actuator associated with at least one of the prisms and can be used in the photolithography system of FIG. 1.
Figure 8B:
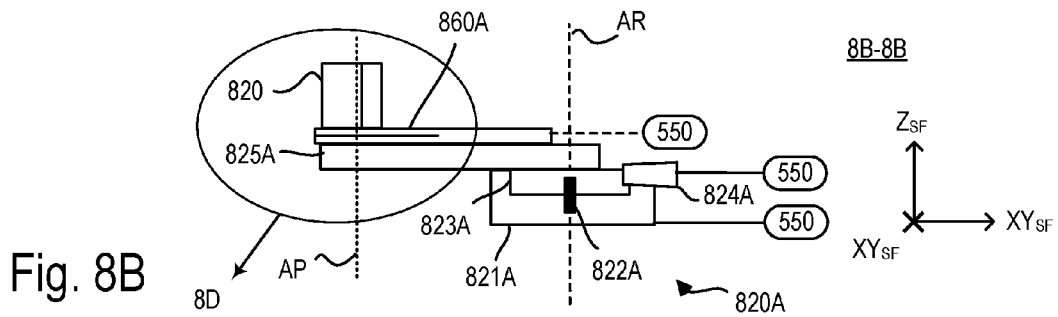
FIG. 8B is a view taken along the 8B-8B section of one of the prisms of the apparatus of FIG. 8A.
Figure 8C:
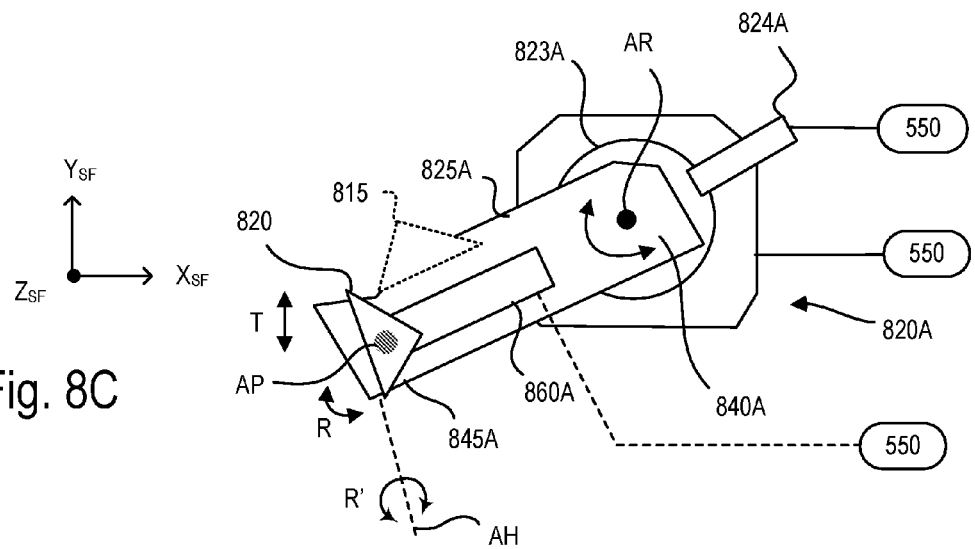
FIG. 8C is a view along the $Z_{SF}$ direction of the prism of FIG. 8B showing rotation of the prism.
Figure 8D:
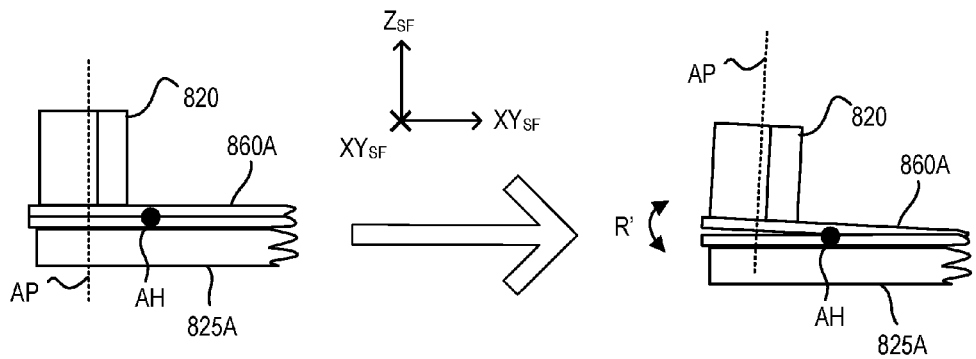
FIG. 8D is a close-up view taken along the 8B-8B section shown in FIG. 8B.

While the examples given above referred to the spectral feature selection apparatus of FIG. 5A, any of the designs for the spectral feature selection apparatuses of FIGS. 6A, 7A, and 8A could instead be used to perform one or more steps in the procedure 1100.

Figure 12:
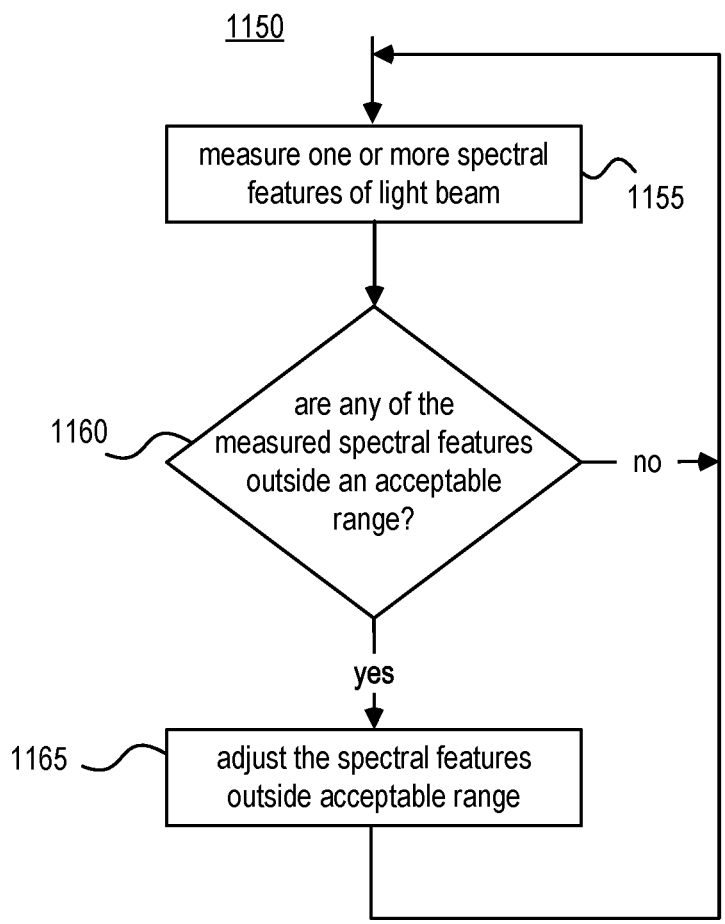
FIG. 12 is a flow chart of an exemplary procedure performed by the photolithography system of FIG. 1 to control one or more spectral features of the pulsed light beam.

Additionally, during the procedure 1100, the control system 185 also performs a parallel procedure 1150, as shown in FIG. 12, for controlling one or more spectral features of the pulsed light beam 110 while the light beam 110 is being scanned across the wafer 120. This procedure 1150 performs independently of whether a lithography performance parameter is outside an acceptable range and thus does not take into account the lithography performance parameter. Nevertheless, the analysis performed by the control system 185 during the procedure 1150 can be used by the control system 185 to also determine how to analyze the received lithography performance parameter (1125) and modify the first spectral feature and maintain the second spectral feature (1130).

The procedure 1150 includes measuring one or more spectral features of the pulsed light beam 110 (1155) and determining whether any of the measured spectral features are outside of an acceptable range of values (1160). For example, the spectral feature analysis module 1025 of the control system 185 can receive the spectral feature measurement from the measurement system 170 (1155). The spectral feature analysis module 1025 can determine whether any of the spectral features are outside an acceptable range of values (1160). If any of the spectral features are outside an acceptable range of values, then those spectral features are adjusted (1165). For example, the decision module 1035 can send a signal to the light source actuation module 1050, which sends a signal to the spectral feature selection apparatus 130 to adjust one or more spectral features of the light beam 110 (1165). This adjustment can be coordinated with any adjustments that need to be made to account for the changes in the wafer characteristics (1130).

The procedure 1150 can be performed during the scanning and at regular intervals, for example, for each exposure field 223 or for each sub-area in which the steps 1120, 1125, 1130 are performed. Moreover, it is possible for the control system 185 to coordinate the adjustment to the first spectral feature needed to compensate for the lithography performance parameter variations (1130) with any required adjustment to the first spectral feature to ensure that the first spectral feature is within an acceptable range of values.

Other implementations are within the scope of the following claims.

What is claimed is:

1. A photolithography apparatus comprising:
an optical source configured to produce a pulsed light beam;
a spectral feature selection system that optically interacts with the pulsed light beam;
a scanning optical system configured to scan the pulsed light beam across a substrate positioned in a lithographic apparatus;
a metrology apparatus configured to determine at least one lithography performance parameter at each sub-area of the substrate, in which a sub-area is a portion of a total area of the substrate and in which a lithography performance parameter is a characteristic associated with the substrate or with the pulsed light beam as it interacts with the substrate; and
a control system connected to the spectral feature selection system, the optical source, and the metrology apparatus, and configured to, at each substrate sub-area:
receive the determined lithography performance parameter;
analyze the determined lithography performance parameter; and
based on the analysis of the determined lithography performance parameter:
modify a first spectral feature of the pulsed light beam by sending a first signal to the spectral feature selection system, wherein the modification of the first spectral feature causes a change in a second spectral feature of the pulsed light beam; and
adjust the second spectral feature of the pulsed light beam to compensate for the change to the second spectral feature that is caused by the modification of the first spectral feature, wherein adjusting the second spectral feature comprises sending a second signal to the spectral feature selection system while the first spectral feature of the pulsed light beam is being modified.

2. The photolithography apparatus of claim 1, wherein each sub-area of the substrate is an exposure field of the substrate or each sub-area corresponds to a single pulse of the light beam.

3. The photolithography apparatus of claim 1, wherein the spectral feature selection system comprises a spectral feature actuation mechanism including an actuation system configured to cause one or more elements of the spectral feature actuation mechanism to be altered to thereby alter interaction with the pulsed light beam.

4. The photolithography apparatus of claim 1, wherein the lithography performance parameter includes one or more of a mean offset of a position of the substrate from a desired position and a stage vibration of the substrate.

5. The photolithography apparatus of claim 1, wherein the lithography performance parameter includes a position of the substrate that varies from central sub-areas of the substrate to sub-areas at an edge of the substrate.

6. A photolithography apparatus comprising:
an optical source configured to produce a pulsed light beam;
a spectral feature selection system that optically interacts with the pulsed light beam, wherein the spectral feature selection system comprises:
a dispersive optical element and a beam expander including at least three refractive optical elements, the pulsed light beam interacting with each of the dispersive optical element and the plurality of refractive optical elements; and
an actuation system that includes a plurality of actuators, each of the actuators in the plurality causing one of the at least three refractive optical elements to rotate relative to the pulsed light beam;
wherein the actuation system includes a rapid actuator associated with at least one of the refractive optical elements, the rapid actuator including a rotation stage that rotates about a rotation axis and includes a region that is mechanically linked to the associated refractive optical element to rotate the associated refractive optical element about the rotation axis;
a scanning optical system configured to scan the pulsed light beam across a substrate positioned in a lithographic apparatus;
a metrology apparatus configured to determine at least one lithography performance parameter at each sub-area of the substrate, in which a sub-area is a portion of a total area of the substrate;
a control system connected to the spectral feature selection system, the optical source, and the metrology apparatus, and configured to, at each substrate sub-area:
receive the determined lithography performance parameter;
analyze the determined lithography performance parameter; and
based on the analysis of the determined lithography performance parameter: modify a first spectral feature of the pulsed light beam by sending a first signal to the spectral feature selection system; and maintain a second spectral feature of the pulsed light beam by sending a second signal to the spectral feature selection system while the first spectral feature of the pulsed light beam is being modified.

7. The photolithography apparatus of claim 6, wherein the rotation of a first refractive optical elements causes the second spectral feature of the pulsed light beam to be changed in a relatively coarse manner, the rotation of a second refractive optical element causes the first spectral feature of the pulsed light beam to be changed in a relatively fine manner, and the rotation of a third refractive optical elements causes the second spectral feature of the pulsed light beam to be changed in a relatively fine manner.

8. The photolithography apparatus of claim 7, wherein the beam expander includes a fourth refractive optical element, and the rotation of the fourth refractive optical element causes the first spectral feature of the pulsed light beam to be changed in a relatively coarse manner.

9. The photolithography apparatus of claim 1, wherein:
the control system analyzes the determined lithography performance parameter by determining whether the lithography performance parameter is outside an acceptable range; and
the control system modifies the first spectral feature of the pulsed light beam if it is determined that the lithography performance parameter is outside an acceptable range by sending the signal to the spectral feature selection system.

10. The photolithography apparatus of claim 1, wherein the scanning optical system is configured to move one or more of the pulsed light beam and the substrate relative to each other along a lateral plane such that the pulsed light beam interacts with each sub-area of the substrate, wherein the lateral plane is perpendicular to an axial direction along which the pulsed light beam is directed.

11. A photolithography method comprising:
producing, from an optical source, a pulsed light beam;
scanning the pulsed light beam across a substrate of a lithography exposure apparatus to expose the substrate with the pulsed light beam including exposing each sub-area of the substrate with the pulsed light beam, wherein a sub-area is a portion of a total area of the substrate; and
for each sub-area of the substrate:
receiving a lithography performance parameter associated with the sub-area of the substrate, wherein the lithography performance parameter is a characteristic associated with the substrate or with the pulsed light beam as it interacts with the substrate;
analyzing the received lithography performance parameter; and
based on the analysis:
modifying at least a first spectral feature of the pulsed light beam, wherein modifying the first spectral feature causes a change in a second spectral feature of the pulsed light beam, and
adjusting at least the second spectral feature of the pulsed light beam to compensate for the change to the second spectral feature that is caused by the modification of the first spectral feature.

12. The method of claim 11, wherein receiving the lithography performance parameter at each sub-area of the substrate comprises receiving the lithography performance parameter at each sub-area of the substrate during scanning of the pulsed light beam across the substrate.

13. The method of claim 11, wherein receiving the lithography performance parameter at the sub-area comprises receiving one or more of: an error on the physical property of the substrate, a contrast of a feature formed on the substrate, a critical dimension at a substrate area exposed to the pulsed light beam, the placement (X,Y location relative to desired/target location) of the feature formed on the substrate relative to a target or relative to an underlying feature, a photoresist profile, a side-wall angle, and a change in position of the substrate; a mean offset of a position of the substrate from a desired position and a stage vibration of the substrate, and a position of the substrate that varies from central sub-areas of the substrate to sub-areas at an edge of the substrate.

14. The method of claim 11, wherein receiving the lithography performance parameter at each sub-area of the substrate comprises receiving the lithography performance parameter at each sub-area of the substrate prior to scanning the pulsed light beam across the substrate.

15. The method of claim 11, wherein:
modifying the first spectral feature comprises modifying the wavelength of the pulsed light beam, and
adjusting the second spectral feature comprises adjusting the bandwidth of the pulsed light beam to within a range of bandwidths.

16. The method of claim 15, wherein adjusting the bandwidth of the pulsed light beam to within the range of bandwidths comprises maintaining the bandwidth of the pulsed light beam to within +/−10 femtometers (fm) or within +/−1 fm.

17. A photolithography method comprising:
producing, from an optical source, a pulsed light beam;
scanning the pulsed light beam across a substrate of a lithography exposure apparatus to expose the substrate with the pulsed light beam including exposing each sub-area of the substrate with the pulsed light beam, wherein a sub-area is a portion of a total area of the substrate; and
for each sub-area of the substrate:
receiving a lithography performance parameter associated with the sub-area of the substrate;
analyzing the received lithography performance parameter; and
based on the analysis, modifying at least a first spectral feature of the pulsed light beam and maintaining at least a second spectral feature of the pulsed light beam;
wherein:
modifying the first spectral feature of the pulsed light beam comprises rotating a first prism system through which the pulsed light beam passes; and
maintaining the second spectral feature of the pulsed light beam comprises rotating a second prism system through which the pulsed light beam passes;
wherein the first prism system and the second prism system are components within a spectral feature selection system.

18. The method of claim 11, further comprising:
at least at each sub-area of the substrate, estimating a spectral feature of the pulsed light beam produced from the optical source;
determining whether the estimated spectral feature is within an acceptable range; and
if it is determined that the estimated spectral feature is not within the acceptable range, then modifying the spectral feature of the pulsed light beam,
wherein the spectral feature is one or more of the first spectral feature and the second spectral feature.

19. The method of claim 11, wherein:
adjusting the second spectral feature of the pulsed light beam happens simultaneously with modifying the first spectral feature of the pulsed light beam.

20. The method of claim 11, wherein analyzing the received lithography performance parameter comprises determining whether a physical property of the substrate is outside an acceptable range based on the lithography performance parameter.

21. The method of claim 11, wherein modifying the first spectral feature of the pulsed light beam causes a modification to a first condition of the pulsed light beam at the substrate and adjusting the second spectral feature of the pulsed light beam causes a second condition of the pulsed light beam at the substrate to be maintained at a particular level.

22. A photolithography method comprising:
producing, from an optical source, a pulsed light beam;
receiving a recipe that correlates edge roll off of a substrate to each sub-area of the substrate, wherein a sub-area is a portion of a total area of the substrate;
scanning the pulsed light beam across the substrate of a lithography exposure apparatus to expose the substrate with the pulsed light beam including exposing each sub-area of the substrate with the pulsed light beam;
modifying at least a wavelength of the pulsed light beam so as to adjust the focal position at the substrate to compensate for edge roll off and based on the sub-area being exposed, wherein the modification of the wavelength of the pulsed light beam causes a change in a bandwidth of the pulsed light beam; and
adjusting at least the bandwidth of the pulsed light beam while the wavelength of the pulsed light beam is being modified to adjust the focal position at the substrate and compensate for edge roll off for the sub-area being exposed and to compensate for the change to the bandwidth that is caused by the modification of the wavelength of the pulsed light beam.

23. The photolithography apparatus of claim 1, wherein the lithography performance parameter is a physical property of the substrate, and the control system is configured to receive the determined value of the physical property of the substrate for each sub-area of the substrate.

24. The photolithography apparatus of claim 1, wherein the optical source includes:
    a first gas discharge stage including a first gas discharge chamber housing an energy source and containing a gas mixture that includes a first gain medium, wherein the first gas discharge stage is configured to generate a first pulsed light beam; and
    a second gas discharge stage including a second gas discharge chamber housing an energy source and containing a gas mixture that includes a second gain medium, wherein the second gas discharge stage is configured to receive the first pulsed light beam and to amplify the first pulsed light beam to thereby produce the pulsed light beam from the optical source.

25. The photolithography apparatus of claim 3, wherein the control system is connected to the actuation system of the spectral feature actuation mechanism such that the first signal is sent to the actuation system of the spectral feature actuation mechanism and the second signal is sent to the actuation system of the spectral feature actuation mechanism.

26. The photolithography apparatus of claim 6, wherein the at least three refractive optical elements includes a first refractive optical element that is farthest from the dispersive optical element, a second refractive optical element adjacent to the first refractive optical element, and a third refractive optical element adjacent to the second refractive optical element.

27. The photolithography apparatus of claim 6, wherein:
    the first refractive optical element is associated with a first rapid actuator that includes a first rotation stage that rotates about a first rotation axis and includes a region that is mechanically linked to the first refractive optical element to rotate the first refractive optical element about the first rotation axis; and
    the third refractive optical element is associated with a second rapid actuator that includes a second rotation stage that rotates about a second rotation axis and includes a region that is mechanically linked to the third refractive optical element to rotate the third refractive optical element about the first rotation axis.

28. The photolithography apparatus of claim 6, wherein the spectral feature selection system includes a reflective optical element between the beam expander and the dispersive optical element.

29. The method of claim 11, wherein the lithography performance parameter is a physical property of the substrate.

30. The method of claim 11, wherein the sub-area of the substrate is an exposure field of the substrate or it corresponds to a single pulse of the light beam.

31. The method of claim 11, further comprising:
    at least at each sub-area of the substrate, estimating the second spectral feature of the pulsed light beam produced from the optical source;
    determining whether the estimated second spectral feature is within an acceptable range; and,
    if it is determined that the estimated second spectral feature is not within the acceptable range, then modifying the second spectral feature of the pulsed light beam.

32. The method of claim 11, wherein modifying at least the first spectral feature of the pulsed light beam and adjusting the at least second spectral feature of the pulsed light beam comprises:
    directing the pulsed light beam through a plurality of prisms toward a diffractive optical element so that the pulsed light beam retro reflects off the diffractive optical element and back through the plurality of prisms; and
    simultaneously rotating the at least two right-angled prisms so that an angle of incidence of the pulsed light beam on the diffractive optical element is changed but the total magnification of the pulsed light beam on the diffractive optical element is unchanged.

33. The method of claim 11, wherein producing the pulsed light beam comprises directing the pulsed light beam through a spectral feature selection system.

34. The method of claim 33, further comprising selecting the first spectral feature of the pulsed light beam by selectively reflecting the pulsed light beam from a diffractive surface of the spectral feature selection system.

35. The method of claim 11, wherein:
    modifying the first spectral feature of the pulsed light beam comprises rotating a mirror on which the pulsed light beam reflects;
    adjusting the second spectral feature of the pulsed light beam comprises rotating a prism system through which the pulsed light beam passes; and
    the mirror and the prism system are components within a spectral feature selection system.

36. The method of claim 11, wherein producing the pulsed light beam from the optical source comprises:
    generating a first pulsed light beam from a first gas discharge stage including selecting the first spectral feature of the pulsed light beam;
    directing the first pulsed light beam to a second gas discharge stage; and
    amplifying the first pulsed light beam in the second gas discharge stage to thereby produce the pulsed light beam from the optical source.

37. The method of claim 17, wherein the first prism system through which the pulsed light beam passes is rotated by rotating two prisms through which the pulsed light beam passes; and the second prism system through which the pulsed light beam passes is rotated by rotating at least two other prisms through which the pulsed light beam passes.

38. The method of claim 37, wherein:
    the two prisms of the first prism system are rotated by actuating one of the prisms of the first prism system in actuation steps that are larger than the actuation steps for actuation of the other of the prisms of the first prism system; and
    the two other prisms of the second prism system are rotated by actuating one of the prisms of the second prism system in actuation steps that are larger than the actuation steps for actuation of the other of the prisms of the second prism system.

39. The photolithography apparatus of claim 3, wherein the control system is connected to the actuation system of the spectral feature actuation mechanism such that the first signal is sent to the actuation system of the spectral feature actuation mechanism and the second signal is sent to the actuation system of the spectral feature action mechanism.

40. The photolithography apparatus of claim 1, wherein the lithography performance parameter is a physical property of the substrate, and the control system is configured to receive the determined physical property of the substrate for each sub-area of the substrate.

41. The photolithography apparatus of claim 6, wherein the at least three refractive optical elements include:
- a first refractive optical element that is farthest from the dispersive optical element, the first refractive optical element being associated with a first rapid actuator that includes a first rotation stage that rotates about a first rotation axis and includes a region that is mechanically linked to the first refractive optical element to rotate the first refractive optical element about the first rotation axis;
- a second refractive optical element adjacent to the first refractive optical element; and
- a third refractive optical element adjacent to the second refractive optical element, the third refractive optical element being associated with a second rapid actuator that includes a second rotation stage that rotates about a second rotation axis and includes a region that is mechanically linked to the third refractive optical element to rotate the third refractive optical element about the first rotation axis.

42. The photolithography apparatus of claim 8, wherein the spectral feature selection system includes a reflective optical element between the beam expander and the dispersive optical element.

43. The photolithography apparatus of claim 1, wherein the optical source includes:
- a first gas discharge stage including a first gas discharge chamber housing an energy source and containing a gas mixture that includes a first gain medium, the first gas discharge stage is configured to generate a first pulsed light beam; and
- a second gas discharge stage including a second gas discharge chamber housing an energy source and containing a gas mixture that includes a second gain medium, the second gas discharge stage is configured to receive the first pulsed light beam and to amplify the first pulsed light beam to thereby produce the pulsed light beam from the optical source.

44. The method of claim 11, wherein producing the pulsed light beam comprises directing the pulsed light beam through a spectral feature selection system, the method further includes selecting the first spectral feature of the pulsed light beam by selectively reflecting the pulsed light beam from a diffractive surface of the spectral feature selection system.

45. The method of claim 11, wherein the sub-area of the substrate is an exposure field of the substrate or it corresponds to a single pulse of the light beam.

46. The method of claim 17, wherein:
- the first prism system through which the pulsed light beam passes is rotated by rotating two prisms through which the pulsed light beam passes; and
- the second prism system through which the pulsed light beam passes is rotated by rotating at least two other prisms through which the pulsed light beam passes.

47. The method of claim 46, wherein:
- the two prisms of the first prism system are rotated by actuating one of the prisms of the first prism system in actuation steps that are larger than the actuation steps for actuation of the other of the prisms of the first prism system; and
- the two other prisms of the second prism system are rotated by actuating one of the prisms of the second prism system in actuation steps that are larger than the actuation steps for actuation of the other of the prisms of the second prism system.

48. The method of claim 11, wherein modifying the first spectral feature of the pulsed light beam comprises rotating a mirror on which the pulsed light beam reflects; and adjusting the second spectral feature of the pulsed light beam comprises rotating a prism system through which the pulsed light beam passes, wherein the mirror and the prism system are components within a spectral feature selection system.

49. The method of claim 11, wherein producing the pulsed light beam from the optical source comprises:
- generating a first pulsed light beam from a first gas discharge stage including selecting the first spectral feature of the pulsed light beam;
- directing the first pulsed light beam to a second gas discharge stage; and
- amplifying the first pulsed light beam in the second gas discharge stage to thereby produce the pulsed light beam from the optical source.

50. The method of claim 11, wherein modifying the at least the first spectral feature of the pulsed light beam and adjusting the at least the second spectral feature of the pulsed light beam comprises:
- directing the pulsed light beam through a plurality of prisms toward a diffractive optical element so that the pulsed light beam retro reflects off the diffractive optical element and back through the plurality of prisms; and
- simultaneously rotating the at least two right-angled prisms so that an angle of incidence of the pulsed light beam on the diffractive optical element is changed but the total magnification of the pulsed light beam on the diffractive optical element is unchanged.

* * * * *